United States Patent
Nagasawa et al.

(10) Patent No.: US 12,068,431 B2
(45) Date of Patent: Aug. 20, 2024

(54) SINGLE-PHOTON SOURCE AND METHOD OF OUTPUTTING SINGLE PHOTON

(71) Applicant: ROHM CO., LTD., Kyoto (JP)

(72) Inventors: Fumiya Nagasawa, Kyoto (JP); Hiroshi Sekiguchi, Kyoto (JP); Yoshinori Miyamae, Kyoto (JP); Koji Taniuchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 431 days.

(21) Appl. No.: 17/486,701

(22) Filed: Sep. 27, 2021

(65) Prior Publication Data
US 2022/0013686 A1 Jan. 13, 2022

Related U.S. Application Data

(63) Continuation of application No. PCT/JP2020/013966, filed on Mar. 27, 2020.

(30) Foreign Application Priority Data

Apr. 2, 2019 (JP) .................................. 2019-070604

(51) Int. Cl.
*H01L 33/06* (2010.01)
*H01L 33/10* (2010.01)
(Continued)

(52) U.S. Cl.
CPC ............ *H01L 33/06* (2013.01); *H01L 33/105* (2013.01); *H01S 5/343* (2013.01); *B82Y 20/00* (2013.01); *H04B 10/70* (2013.01)

(58) Field of Classification Search
CPC ..... H01L 33/06; H01L 33/105; H01L 33/025; H01L 33/502; H01S 5/343; B82Y 20/00; H04B 10/70
See application file for complete search history.

(56) References Cited

U.S. PATENT DOCUMENTS

2002/0196827 A1* 12/2002 Shields ...................... H01S 5/10
257/14
2004/0197070 A1* 10/2004 Takemoto ................. G02F 2/02
385/147
(Continued)

FOREIGN PATENT DOCUMENTS

CN 106784226 5/2017
JP 2004-253657 9/2004
(Continued)

OTHER PUBLICATIONS

Mizuochi, Norikazu, "Single Photon Emission and Quantum Information Device by Using NV Center in Diamond," Japanese journal of optics, 2014, vol. 43, No. 8, pp. 376-381; with machine translation (English abstract previously provided); Cited in Japanese Office Action.

(Continued)

*Primary Examiner* — Karen Kusumakar
(74) *Attorney, Agent, or Firm* — HSML P.C.

(57) ABSTRACT

A single-photon source includes a substrate of a wide-bandgap semiconductor provided with a light-emission region including only one target point detect, a cover mask arranged on a main surface of the substrate and having an opening to which the light-emission region in the substrate is exposed, and an excitation system configured to shift an electron in a defect-ground state to an excited state at the point defect in the light-emission region. A single photon released from the point defect in the light-emission region when the electron in the excited state is shifted to the ground state is output through the opening in the cover mask.

20 Claims, 14 Drawing Sheets

(51) Int. Cl.
*H01S 5/343* (2006.01)
*B82Y 20/00* (2011.01)
*H04B 10/70* (2013.01)

(56) References Cited

U.S. PATENT DOCUMENTS

| | | |
|---|---|---|
| 2011/0272671 A1 | 11/2011 | Skiba-Szymanska et al. |
| 2011/0309265 A1 | 12/2011 | Babinec et al. |
| 2016/0340578 A1 | 11/2016 | Maki |
| 2019/0288160 A1* | 9/2019 | Atature .................. H01L 33/32 |

FOREIGN PATENT DOCUMENTS

| | | |
|---|---|---|
| JP | 2011-238929 | 11/2011 |
| JP | 2017-175096 | 9/2017 |

OTHER PUBLICATIONS

Office Action issued for Japanese Patent Application No. 2021-511983, Sep. 19, 2023, 6 pages with machine translation.
Mizuochi, Norikazu, "Single Photon Emission and Quantum Information Device by Using NV Center in Diamond," Japanese journal of optics, 2014, vol. 43, No. 8, pp. 376-381; English abstract on pp. 376; Cited in the ISR.
Leifgen, M. et al., "Evaluation of nitrogen- and silicon-vacancy defect centres as single photon sources in quantum key distribution," New J. Phys. 16, 023021 (2014), 13 pages.
Isoya, Junichi "Application to quantum information devices, magnetic sensors, biosensors" New Diamond, Japan New Diamond Forum, 2011, vol. 27 No. 4, pp. 12-18; English abstract and machine translation provided.
Aharonovich, I. et al., "Solid-state single-photon emitters," Nature Photonics 10, 631 (2016), pp. 631-641.
International Search Report and Written Opinion of PCT/JP2020/013966, Jun. 30, 2020, 11 pages including English translation of the International Search Report.

* cited by examiner

SINGLE-PHOTON SOURCE AND METHOD OF OUTPUTTING SINGLE PHOTON

CROSS REFERENCE TO RELATED APPLICATIONS AND INCORPORATION BY REFERENCE

This is a continuation application (CA) of PCT Application No. PCT/JP2020/013966, filed on Mar. 27, 2020, which claims priority to Japan Patent Application No. P2019-070604 filed on Apr. 2, 2019 and is based upon and claims the benefit of priority from prior Japanese Patent Application No. P2019-070604 filed on Apr. 2, 2019 and PCT Application No. PCT/JP2020/013966, filed on Mar. 27, 2020; the entire contents of each of which are incorporated herein by reference.

BACKGROUND OF THE INVENTION

1. Field of the Invention

The present disclosure relates to a single-photon source that outputs single photons and a method of outputting single photons.

2. Description of the Related Art

Development on sensing, quantum cryptography communication, and quantum computing using defects in crystals (point defects) in wide-bandgap semiconductors is underway. For example, development has revealed that the use of nitrogen-vacancy (NV) defects in diamond enables scalable sensing of magnetic fields, electric fields, temperatures, and the like, and can implement constitutional elements for a single-photon source, a quantum repeater, and quantum computing used in the quantum cryptography communication. The application of this technology uses photons emitted from a defect level of point defects.

Particularly for the application to the quantum cryptography communication or the quantum computing, single photons emitted from a single point defect need to be selectively extracted so as to use a quantum state of the single point defect. The technique for extracting the single photons emitted from the target point defect is thus quite important.

The technique of sensing by use of point defects in a wide-bandgap semiconductor reads photons emitted from the point defects so as to measure physical amounts such as magnetic fields, electric fields, and temperatures. This sensing method, which uses the emission of light from the point defects at the atomic level, has the ability of spatial resolving power at the scale of nanometers. Although single photons are not necessarily used for the local sensing, only the photons emitted from the point defects present in a target region are necessarily selectively extracted while the emission of light from an unintended region is prevented even when the emission of light from the plural point defects is to be measured.

To efficiently extract photons from point defects present in a target region, a high-magnification lens is typically used to focus on marked defects. For example, an inspection of quantum cryptography communication by use of NV defects in diamond uses an objective lens to concentrate light. Research and development regarding the improvement in efficiency of light concentration for application to devices is known that uses a solid immersion lens and an optical resonator. Examples of optical resonators include a nanowire, a nanopillar, a photonic crystal, a microring resonator, and a microdisc. Special fine processing is particularly required for the solid immersion lens and the optical resonator when manufactured.

Research and development for ideal single-photon sources, which take an important role for generating cipher keys in quantum cryptography communication, particularly emphasizes quantum dots. However, InAs quantum dots having developed recently have a problem of being inactive at room temperature. The method using single point defects in a wide-bandgap semiconductor currently lags behind the quantum dot method, but has the advantage of generating single photons at room temperature.

To transfer quantum information by polarization of photons through the quantum cryptography communication, an optical pulse including only one photon needs to be output at an intended timing. The conventional single-photon sources, however, have been used in the quantum cryptography communication only for simulated cases and have a probability of simultaneously outputting a plurality of photons, while a single-photon source that can output a photon one by one does not reach the stage of practical application yet excluding the photon dot method. In addition, the single-photon sources formed by the quantum dot method still have a problem of activating only at extremely low temperature (about several to several tens of kelvins).

SUMMARY OF THE INVENTION

An aspect of one or more embodiments provides a single-photon source including a substrate of a wide-bandgap semiconductor provided with a light-emission region including only one target point detect, a cover mask arranged on a main surface of the substrate and having an opening to which the light-emission region in the substrate is exposed, and an excitation system configured to shift an electron in a defect-ground state to an excited state at the point defect in the light-emission region, wherein a single photon released from the point defect in the light-emission region when the electron in the excited state is shifted to the ground state is output through the opening in the cover mask.

Another aspect of one or more embodiments provides a method of outputting a single photon including forming a light-emission region including only one target point defect in a substrate of a wide-bandgap semiconductor, arranging a cover mask having an opening on a main surface of the substrate so as to expose the light-emission region in the substrate to the opening, shifting an electron in a defect-ground state to an excited state at the point defect in the light-emission region, and outputting a single photon released from the point defect in the light-emission region through the opening in the cover mask when the electron in the excited state is shifted to the ground state.

DETAILED DESCRIPTION OF THE INVENTION

Figure 1:
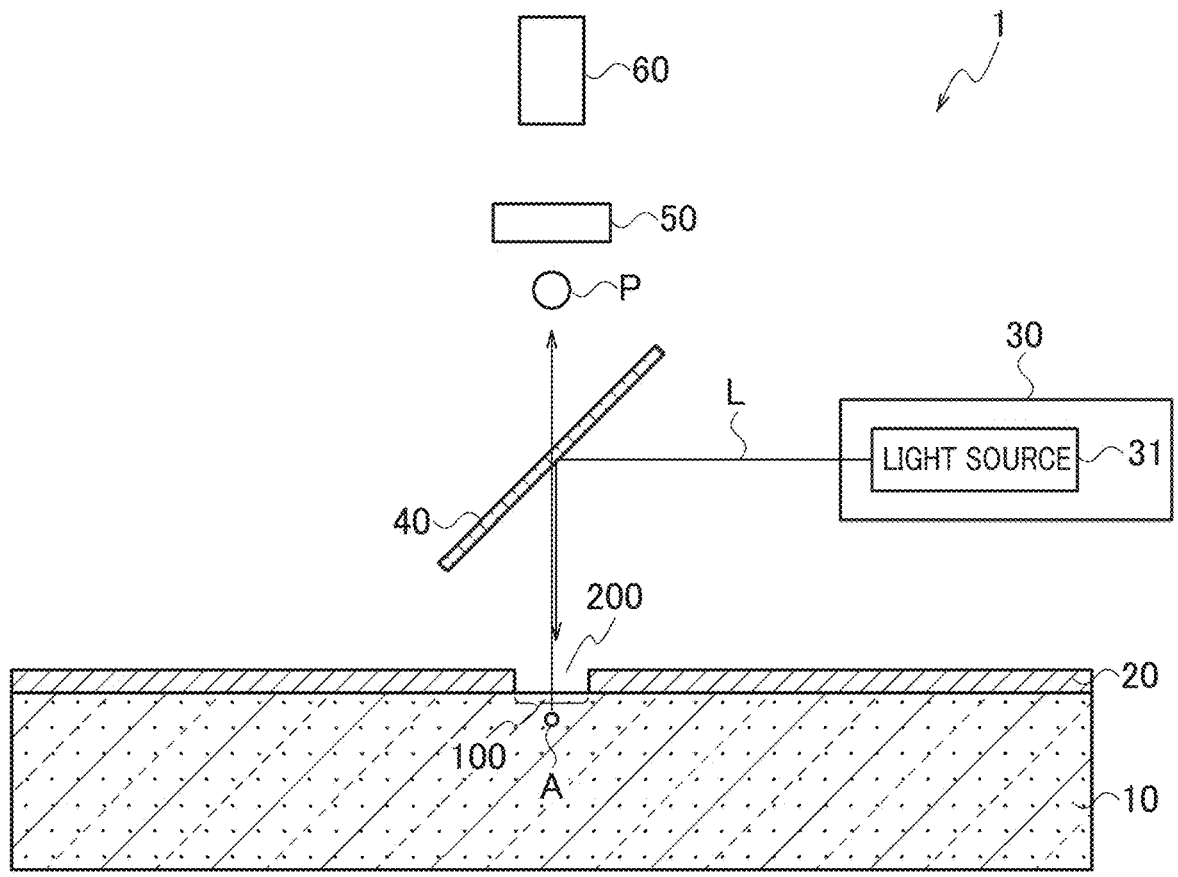
FIG. 1 is a schematic cross-sectional view illustrating a configuration of a single-photon source according to a first embodiment.

Embodiments of the present invention are described below with reference to the drawings. The same or similar elements illustrated in the drawings are denoted below by the same or similar reference numerals. It should be understood that the drawings are illustrated schematically, and the relationships between the thicknesses and the planar dimensions or the proportions of the thicknesses of the respective elements in the drawings are not drawn to scale. It should also be understood that the dimensional relationships or proportions between the respective drawings can differ from each other.

The embodiments described below illustrate a device and a method for embodying the technical idea of the present invention, but the respective embodiments are not intended to be limited to the shapes, structures, or arrangements of the constituent elements as described herein. The respective embodiments can be variously modified within the technical scope of the appended claims.

First Embodiment

A single-photon source 1 according to a first embodiment includes a substrate 10 provided with a light-emission region 100 including only one target point defect A, and a cover mask arranged on the main surface of the substrate 10, as illustrated in FIG. 1. The substrate 10 is a wide-bandgap semiconductor. The cover mask 20 is provided with an opening 200 to which the light-emission region 100 in the substrate 10 is exposed.

Figure 2:
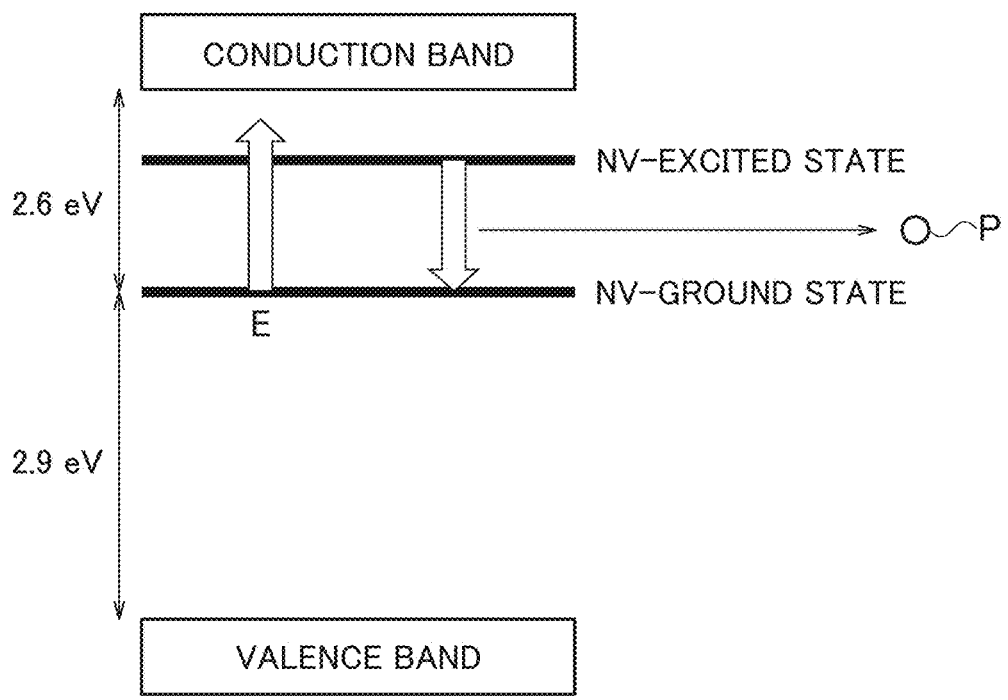
FIG. 2 is a schematic view for explaining a release of a single photon by electronic excitation.

As illustrated in FIG. 2, the single-photon source 1 shifts electrons in a NV-ground state (referred to below as a "ground state") to a NV-excited state (referred to below as an "excited state") at the point defect A in the substrate 10 by excitation energy E applied by an excitation system as described below. A single photon P, which is released from the point defect A when the electrons in the excited state are shifted to the ground state, is output to the outside through the opening 200 of the cover mask 20. For example, the single photon P of 1.9 eV (a wavelength of 637 nm) is released from the substrate 10 having 5.5 eV of a bandgap that is 2.9 eV from a valence band to the ground state and 2.6 eV from the ground state to a conduction band.

To shift the electrons from the defect-ground state to the excited state at the point defect A in the substrate 10, a method may be employed that uses photoluminescence (PL) to apply optical energy to the electrons (referred to below as a "PL method"). Alternatively, a method may be employed that uses electroluminescence (EL) to apply electrical energy to the electrons (referred to below as an "EL method").

The single-photon source 1 illustrated in FIG. 1 includes an excitation light irradiation device 30 as an excitation system by the PL method. The excitation light irradiation device 30 irradiates the light-emission region 100 exposed to the opening 200 of the cover mask 20 with an excitation light L emitted from a light source 31 after changing an optical path via an optical element 40 such as a dichroic mirror or a beam splitter, so as to excite the electrons by the optical energy.

Figure 3:
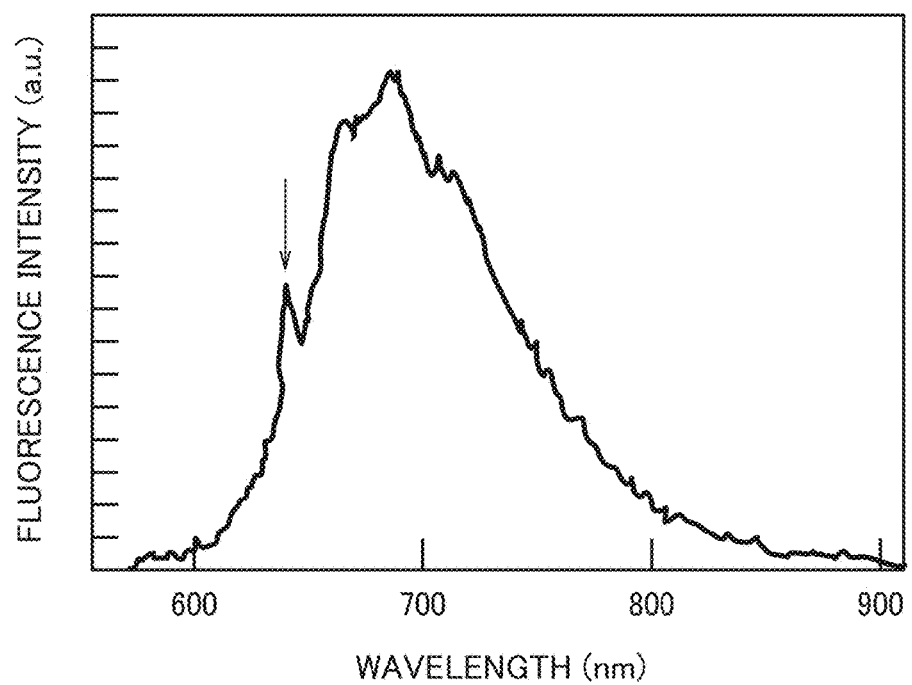
FIG. 3 is a graph showing a fluorescence spectrum by photoluminescence regarding a point defect.

The single photon P is released with a specific wavelength from the substrate 10, as indicated by the arrow in FIG. 3.

FIG. 3 shows a fluorescence spectrum by the PL method regarding NV-in diamond, in which the axis of ordinates has a correlation with the number of the single photons P to be released.

The single-photon source 1 only output the single photon excited at the point defect A as the single photon P to the outside from the substrate 10. The single-photon source 1 thus limitedly includes one point defect A provided at least in the light-emission region 100. For example, the substrate 10 having no or a quite small number of target point defects is prepared so as to intentionally form the single target point defect A in the light-emission region 100.

In addition, to reduce the influence by a heat disturbance as much as possible, for example, the substrate 10 made of material having a wide bandgap is used. Preferred examples of material used for the substrate 10 include diamond, silicon carbide (SiC), gallium nitride (GaN), zinc oxide (ZnO), and hexagonal boron nitride (h-BN). Other material having a bandgap of about 3 eV or greater, for example, may also be used for the substrate 10.

The optical energy by the excitation light L needs to be set to a level that can shift the electrons from the ground state at the point defect to the excited state. The wavelength of the excitation light L is 532 nm, for example. The excitation energy is set as appropriate depending on the material used for the substrate 10 or the type of the point defect so as to avoid the direct excitation from the ground state at the point defect to the conduction band or prevent the charge state at the point defect from being changed as much as possible. For example, the excitation light L is used that has a wavelength of 532 nm in the case of the NV-defect in diamond or has a wavelength of 532 nm or 730 nm in the case of a Si defect in SiC. The type of the defect is not identified, but the excitation light L is used that has a wavelength of 532 nm also in the case of GaN, h-BN, or ZnO.

The single-photon source 1 illustrated in FIG. 1 outputs the single photon P released from the point defect A through the opening 200 of the cover mask 20. The cover mask 20 avoids the output of single photons from other regions excluding the light-emission region 100. The single-photon source 1 thus can limitedly output the single photon P to the outside only from the point defect A of the light-emission region 100 if point defects or any other defects through which photons are released would be formed in other regions excluding the light-emission region 100 in the substrate 10.

The single-photon source 1 can generate an optical pulse including only one photon at an intended timing. The cover mask 20 is made of material that prevents photons from passing therethrough. Examples of material used for the cover mask 20 include metallic material such as aluminum (Al) and resin containing pigment having light-blocking properties.

In the single-photon source 1 illustrated in FIG. 1, the single photon P released from the point defect A enters a light-receiving surface of a light-receiving device 60 after passing through a filter 50. The light-receiving device 60 is an optical fiber cable or a light detector, for example.

Figure 4:
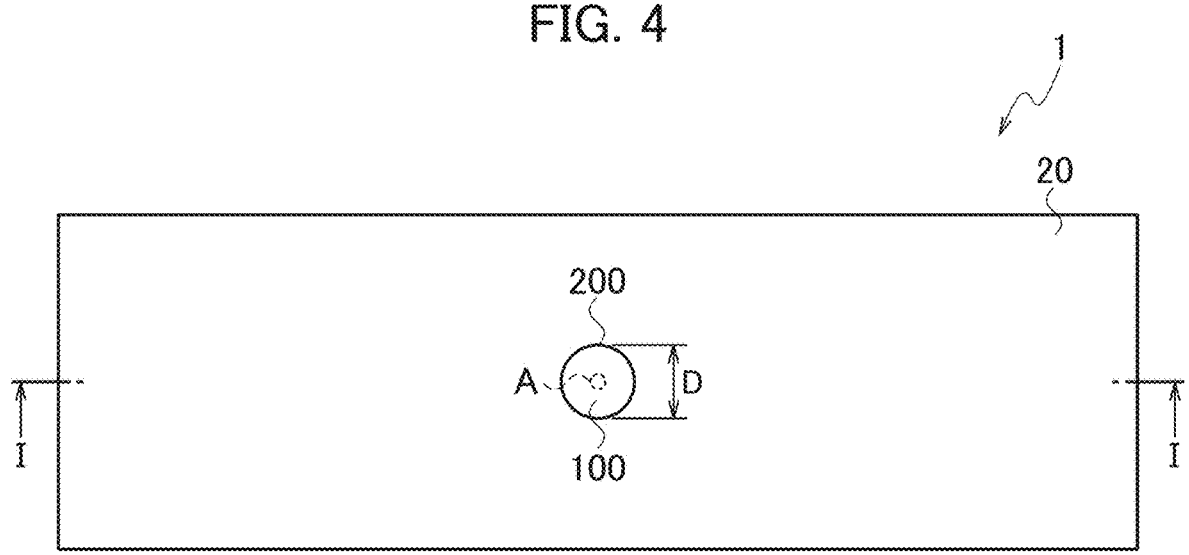
FIG. 4 is a schematic plan view illustrating the configuration of the single-photon source according to the first embodiment.

As illustrated in FIG. 4, the opening 200 of the cover mask 20 has a circular shape having a diameter D of several micrometers, for example. FIG. 1 is the cross-sectional view taken along line I-I in FIG. 4. The opening 200 is not limited to the circular shape, and may have a polygonal shape such as a rectangular shape, for example. The opening 200 may have any size and shape that lead only the light-emission region 100 to be exposed to the opening 200.

Figure 5:
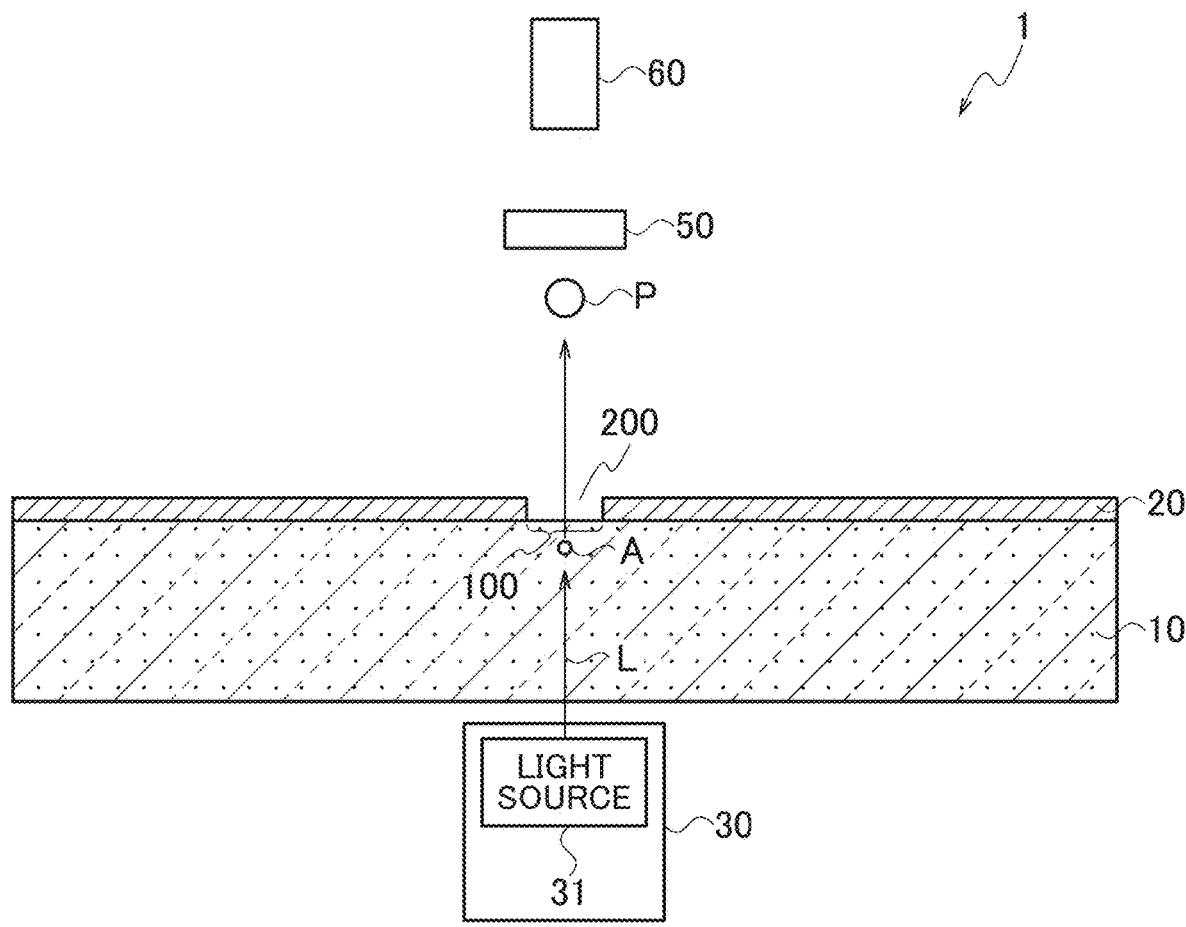
FIG. 5 is a schematic plan view illustrating another configuration of the single-photon source according to the first embodiment.

The excitation light L may be emitted toward the substrate 10 from the main surface side in the vertical direction, as illustrated in FIG. 1, or may be emitted toward the substrate 10 from the rear surface side, as illustrated in FIG. 5. The FIG. 5 illustrates a case in which the excitation light L emitted from the light source 31 of the excitation light irradiation device 30 toward the light-emission region 100 passes through the opening 200 together with the single photon P output from the point defect A of the light-emission region 100. The single photon P only passes through the filter 50 to be output to the outside, while the excitation light L is blocked by the filter 50. For example, an optical waveguide may be provided along the path through which the single photon P passes.

To intentionally form the point defect A to serve as the single-photon source in the light-emission region 100, the light-emission region 100 is irradiated with a pulse laser with a wavelength of 790 nm having a pulse width of 250 fs at a predetermined position. Alternatively, the point defect A may be formed by ion implantation on the main surface of the substrate 10.

Figure 6:
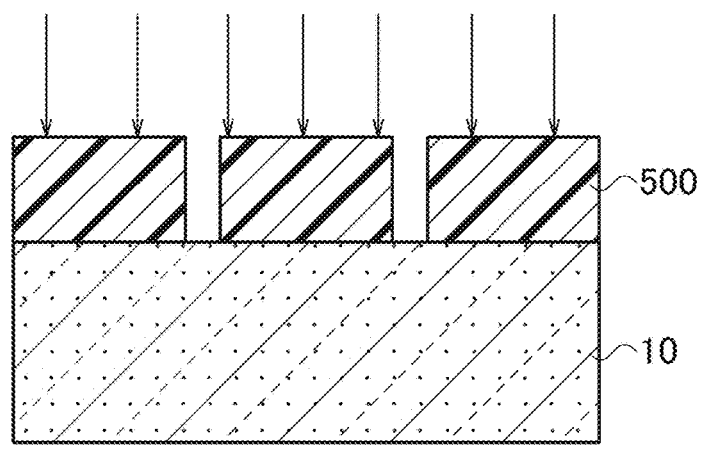
FIG. 6 is a schematic view showing an example of a method of forming point defects.

When forming a Si defect in SiC, for example, an electron-beam resist 500 provided on the main surface of the substrate 10 is delineated by electron-beam lithography so as to expose regions in which point defects are formed, as illustrated in FIG. 6. The electron-beam resist 500 to be used is made of material such as polymethyl methacrylate (PMMA) having a thickness of about 300 nm, and openings having a diameter of several tens of nanometers are formed on the electron-beam resist 500. Thereafter, carbon ions are implanted to the substrate 10 from above of the electron-beam resist 500 with energy of about 30 keV so as to form the point defects A.

While FIG. 6 illustrates the case of being provided with the plural point defects, a gap between the respective point defects to be formed is set to be wider than the diameter D of the opening 200 of the cover mask 20, so as to output the single photons P one by one through the respective openings 200. The provision of the plural point defects can ease the accuracy of positioning between the substrate 10 and the cover mask 20. The present embodiment of course can also be applied to a case in which the electron-beam resist 500 is provided with the single opening.

The point defect A is formed at a particular depth from the main surface of the substrate 10. The quantum state of the point defect A is influenced by impurities or defects having surrounding unpaired electrons. To avoid the influence by the impurities or defects present on the main surface of the substrate 10, the point defect A is formed at a depth of several hundreds of nanometers to several tens of micrometers from the main surface of the substrate 10. When the influence on the main surface is intentionally positively used in a quantum sensor application, the defect, when being the NV-defect in diamond, is formed at a position shallower than 50 nm from the main surface by δ doping.

Figure 7:
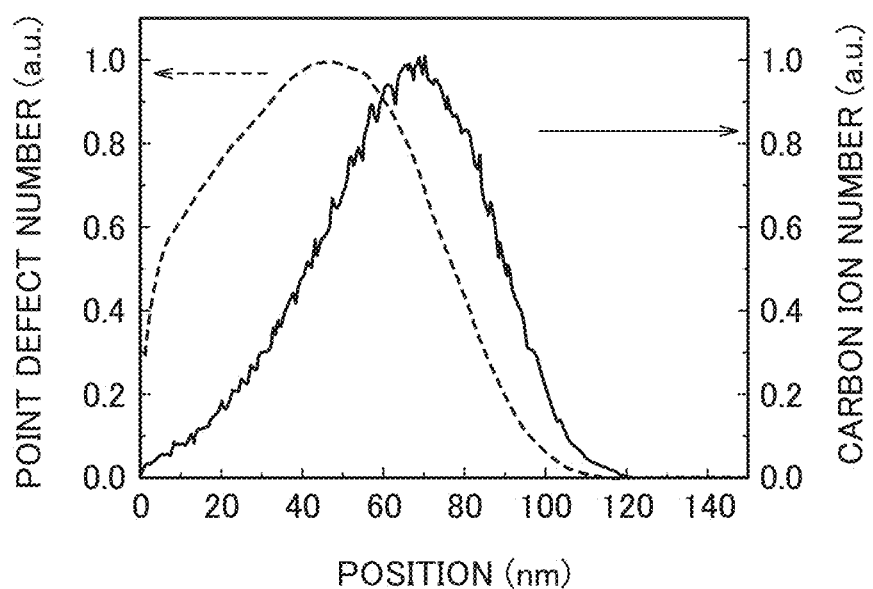
FIG. 7 is a schematic view showing an example of a relationship between an implanted depth of carbon ions and a formed depth of the point defect.

FIG. 7 is a graph showing a correlation between the implanted depth of the carbon ions and the position of the point defect A formed in the substrate 10 on the basis of the distance from the main surface of the substrate 10. As shown in FIG. 7, the point defect A is formed at the position slightly shallower than the depth in which the carbon ions are implanted. For example, the carbon ions are implanted to a position of 70 μm from the main surface of the substrate 10 so as to form the point defect A at a position of about 40 μm from the main surface of the substrate 10. The point defect A may be formed at an appropriate position depending on the material used for the substrate 10.

Figure 8:
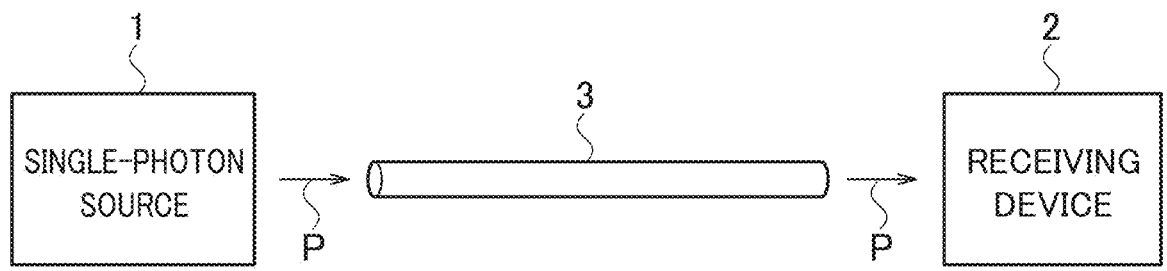
FIG. 8 is a schematic view illustrating a quantum communication system using the single-photon source according to the first embodiment.

As described above, the method of outputting the single photon by use of the single-photon source 1 according to the first embodiment can output the single photon P at room temperature. The outputting method can also optically stably output the single photon P one by one. The use of the single-photon source 1 thus can easily configure the quantum cryptography communication system by use of the single photons. For example, the single photon P output from the single-photon source 1 is guided to an incident surface of an optical fiber 3, as illustrated in FIG. 8. The transfer of the single photon P via the optical fiber 3 can share a cipher key between the single-photon source 1 and a receiving device 2 located distant therefrom. The quantum cryptography communication without use of the optical fiber may also be presumed to use the single-photon source 1 that outputs the single photon P at room temperature. The single-photon source 1 according to the first embodiment can be easily manufactured since the configuration thereof is not complicated.

First Modified Example

Figure 9:
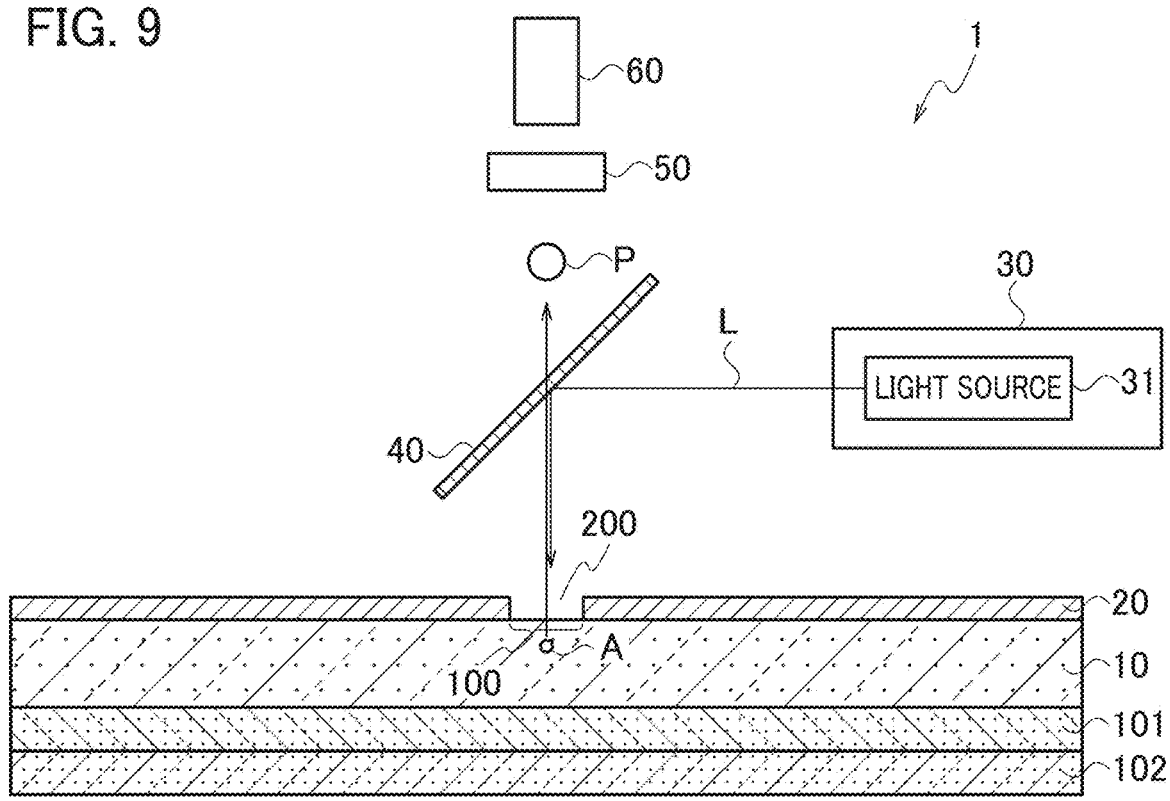
FIG. 9 is a schematic cross-sectional view illustrating a configuration of a single-photon source according to a first modified example of the first embodiment.

The use of a distributed Bragg mirror having a periodical multi-layer film structure is an alternative example, as illustrated in FIG. 9. The single-photon source 1 illustrated in FIG. 9 includes a distributed Bragg mirror 101 arranged on the rear surface of the substrate 10. The distributed Bragg mirror 101 implements a photonic bandgap that reflects a specific wavelength. The distributed Bragg mirror 101 as used herein is designed to reflect light having a wavelength of the single photon P, so as to avoid a release of the single photon P from the target point defect A toward the rear surface side of the substrate 10 to improve the efficiency of light concentration. The substrate 10 in the single-photon source 1 illustrated in FIG. 9 is arranged on the distributed Bragg mirror 101 mounted on a support substrate 102. The support substrate 102 is made of material selected as appropriate depending on the material used for the distributed Bragg mirror 101.

Figure 10:
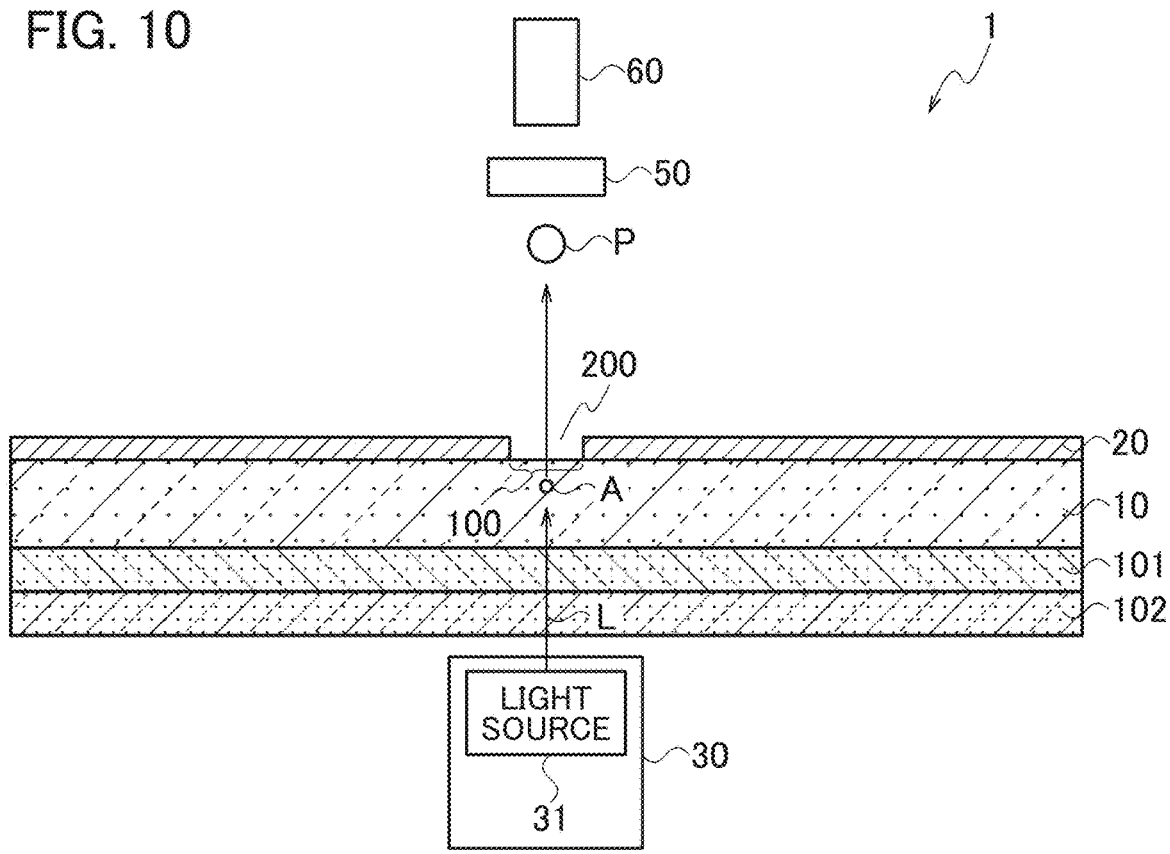
FIG. 10 is a schematic cross-sectional view illustrating another configuration of the single-photon source according to the first modified example of the first embodiment.

FIG. 10 illustrates the single-photon source 1 having a configuration that uses the distributed Bragg mirror 101, as in the case illustrated in FIG. 9, but irradiates the excitation light L from the rear surface side of the substrate 10. Since the distributed Bragg mirror 101 allows light having a wavelength other than a designed specific wavelength to pass therethrough, the excitation light L can be irradiated from rear surface side of the substrate 10, as illustrated in FIG. 10.

Figure 11:
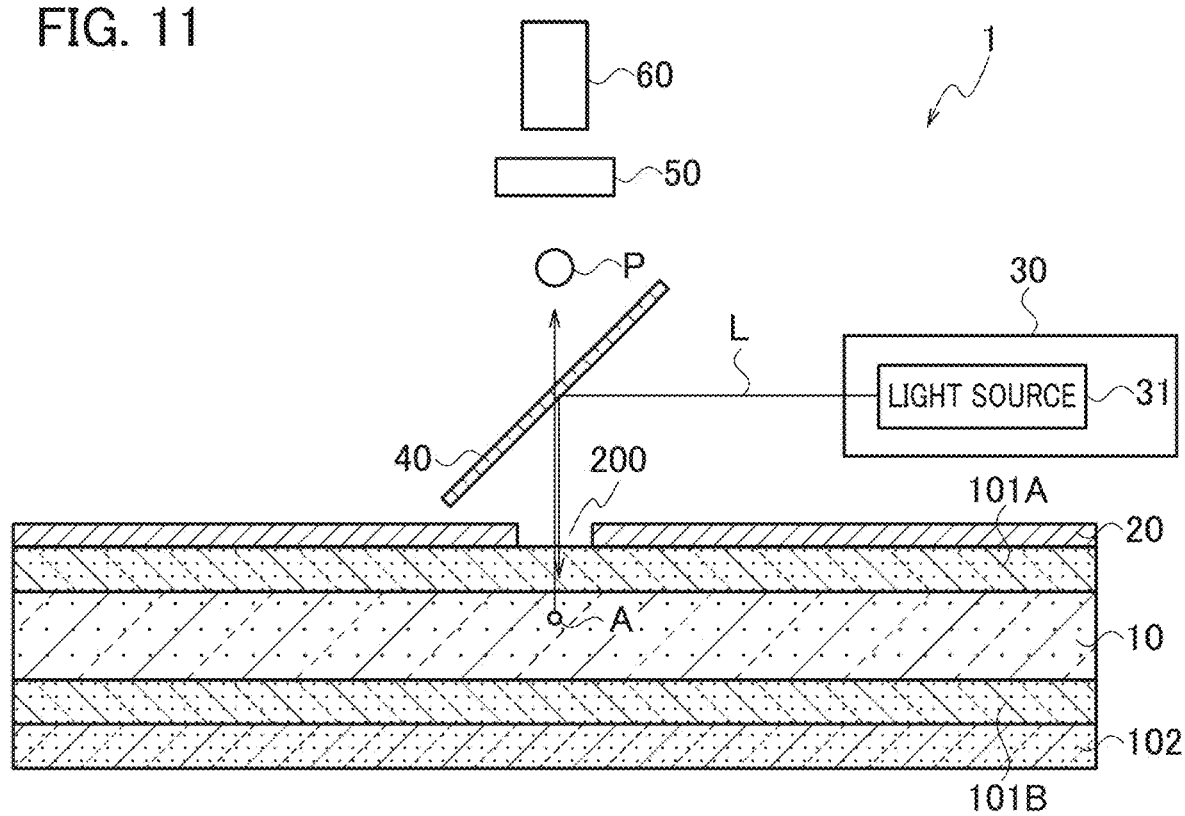
FIG. 11 is a schematic cross-sectional view illustrating still another configuration of the single-photon source according to the first modified example of the first embodiment.

The use of an optical resonator using two distributed Bragg mirrors is another alternative example, as illustrated in FIG. 11. The single-photon source 1 illustrated in FIG. 11 includes the optical resonator implemented such that the substrate 10 provided with the point defect A is interposed between an upper distributed Bragg mirror 101A and a lower distributed Bragg mirror 101B. The optical resonator resonates the light having the wavelength of the single photon P released from the target point defect A between the upper distributed Bragg mirror 101A and the lower distributed Bragg mirror 101B. The resonation can increase the releasing speed of the single photon P more than a natural releasing speed. The use of the optical resonator combined together can also improve the directivity of the photon release.

Figure 12:
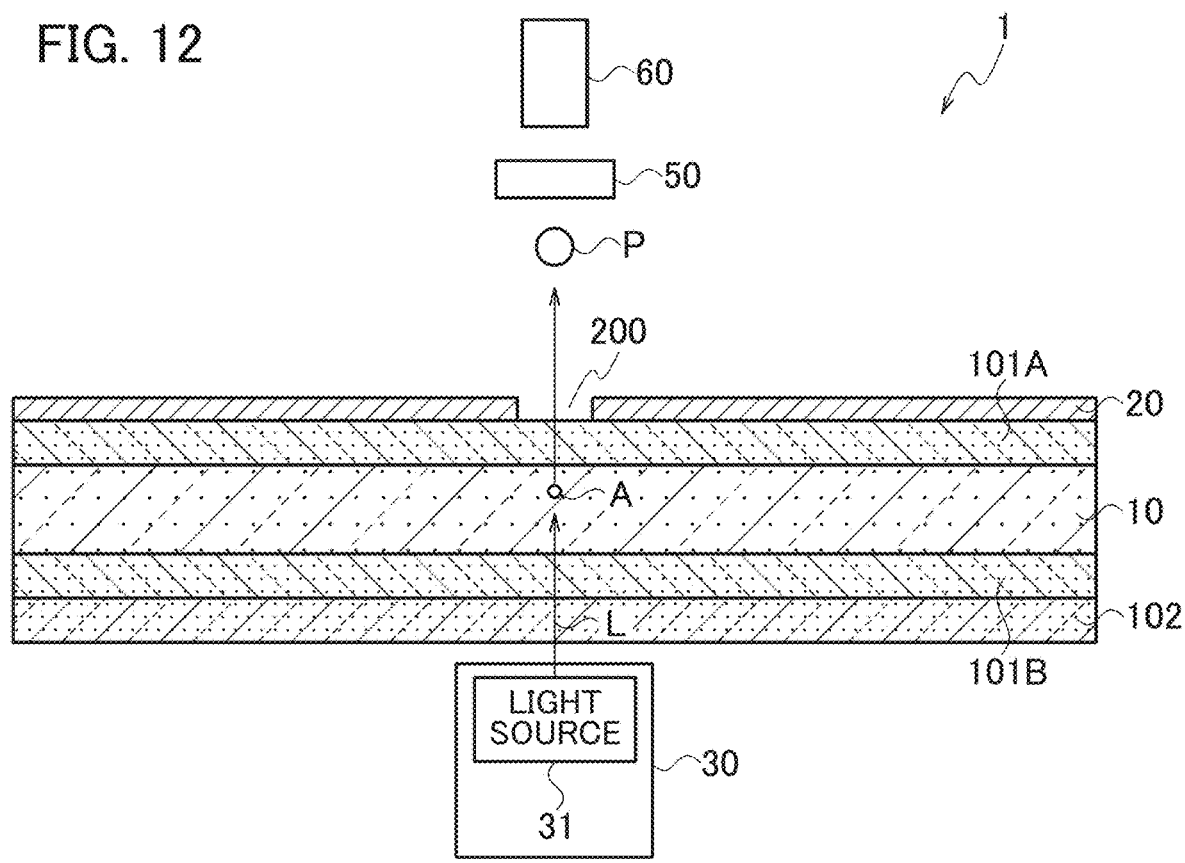
FIG. 12 is a schematic cross-sectional view illustrating still another configuration of the single-photon source according to the first modified example of the first embodiment.
Figure 13:
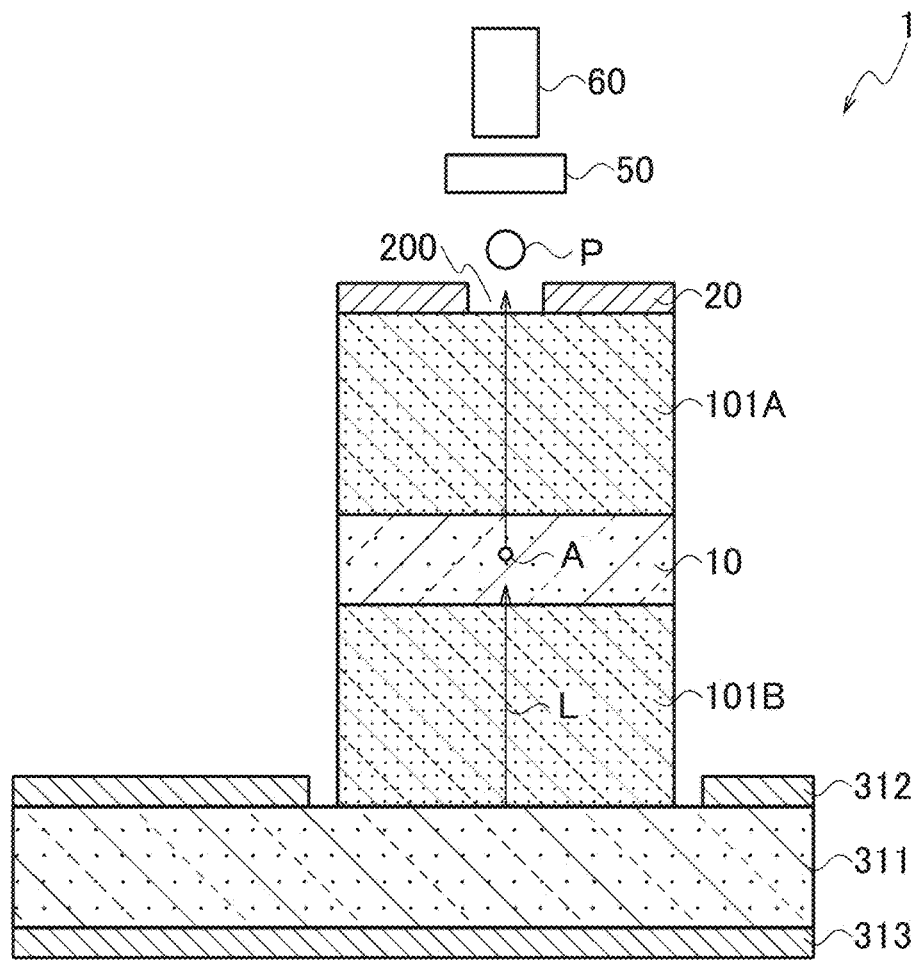
FIG. 13 is a schematic cross-sectional view illustrating still another configuration of the single-photon source according to the first modified example of the first embodiment.

The single-photon source 1 illustrated in FIG. 12, which uses the optical resonator as in the case illustrated in FIG. 11, differs from the single-photon source 1 illustrated in FIG. 11 in irradiating the excitation light L from the rear surface side of the substrate 10. The single-photon source 1 illustrated in FIG. 12 may be configured as illustrated in FIG. 13, for example. The single-photon source 1 illustrated in FIG. 13 includes an LED layer 311 electrically drivable as a light source on the rear surface side of the substrate 10.

Figure 14:
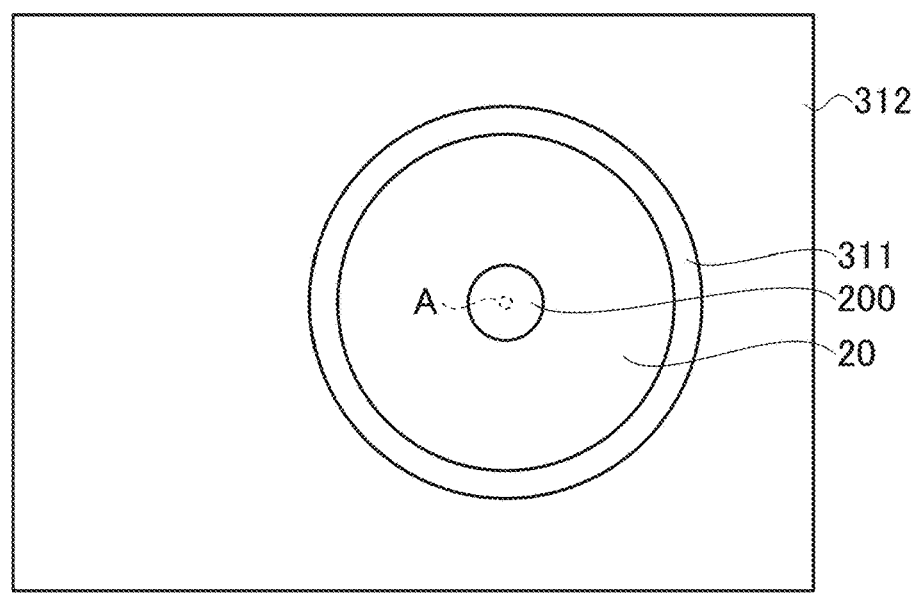
FIG. 14 is a schematic plan view illustrating the single-photon source illustrated in FIG. 13.

In particular, the LED layer 311 is arranged between an upper electrode 312 and a lower electrode 313, and the lower distributed Bragg mirror 101B is connected to the surface of the LED layer 311 exposed to an opening provided in the upper electrode 312. The optical resonator is implemented such that the substrate 10 is interposed between the upper distributed Bragg mirror 101A and the lower distributed Bragg mirror 101B. FIG. 14 is a plan view of the single-photon source 1 illustrated in FIG. 13. A drive current is applied to flow between the upper electrode 312 and the lower electrode 313 so as to emit the excitation light L from the LED layer 311.

Second Modified Example

Figure 15:
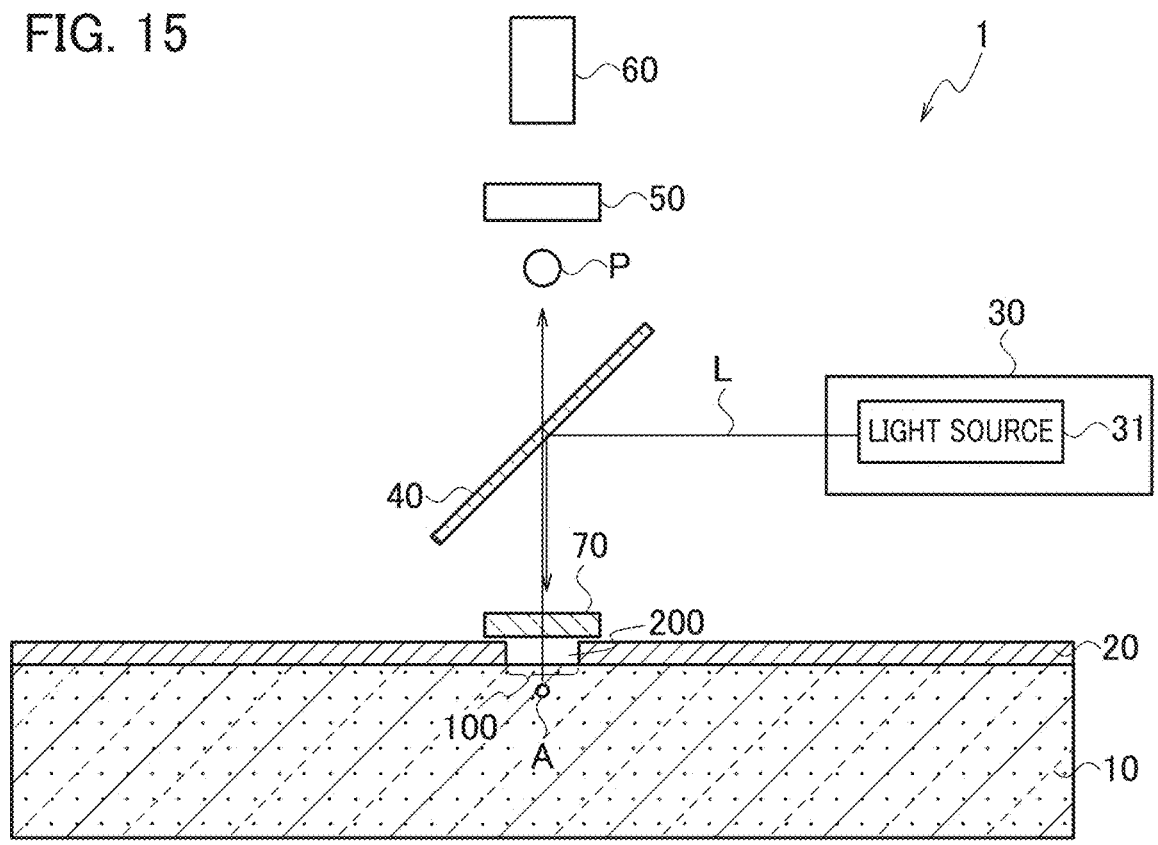
FIG. 15 is a schematic cross-sectional view illustrating a configuration of a single-photon source according to a second modified example of the first embodiment.

The single-photon source 1 according to a second modified example illustrated in FIG. 15 further includes a lens 70 that is arranged immediately above the light-emission region 100 and allows the single photon P to pass therethrough. For example, the single photons P sequentially output from the point defect A are concentrated by the lens 70, so as to lead the single photons P to accurately enter the incident surface of the optical fiber or the receiving device.

The use of a collimator lens as the lens 70 can collimate and output the single photons P emitted from the point defect A to the outside. The lens 70 used in the single-photon source 1 illustrated in FIG. 15 is made of material that allows the single photons P to pass therethrough and allows the excitation light L to pass therethrough.

Figure 16:
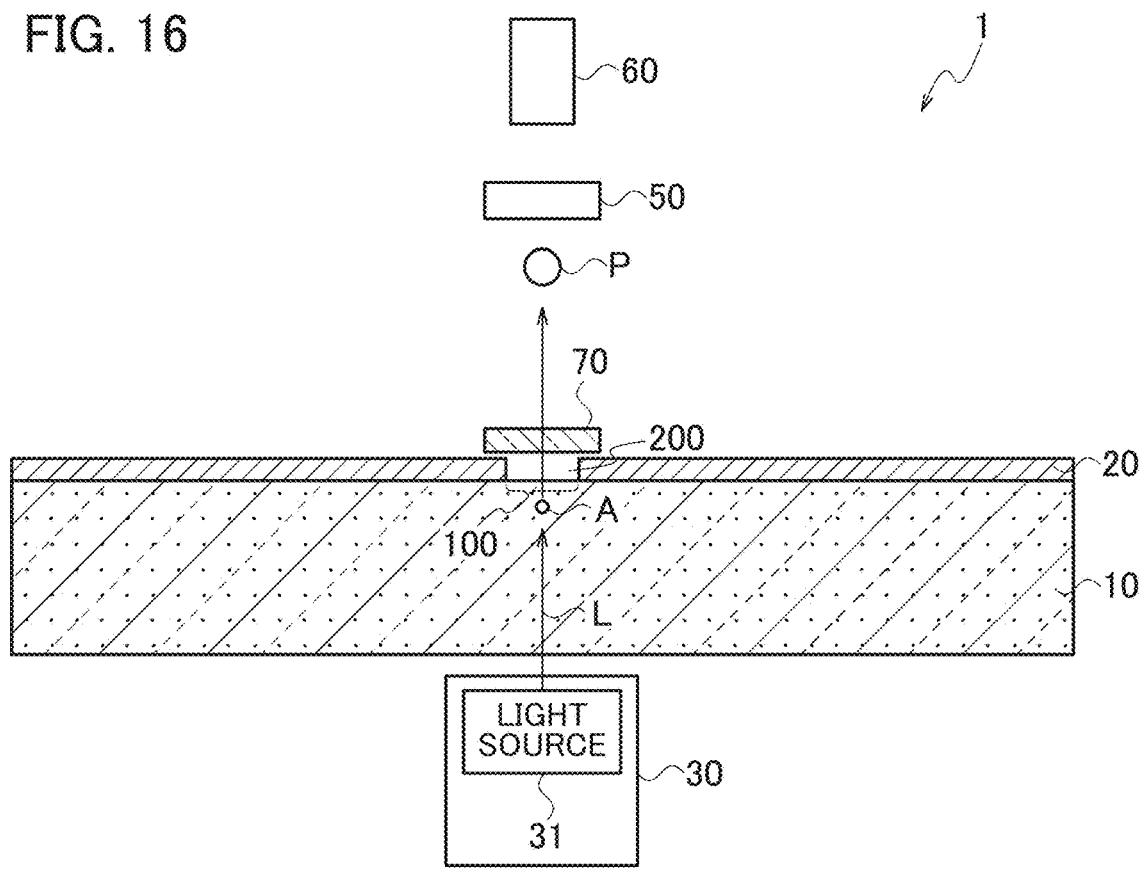
FIG. 16 is a schematic cross-sectional view illustrating another configuration of the single-photon source according to the second modified example of the first embodiment.

The single-photon source 1 illustrated in FIG. 16 uses the excitation system by the PL method in which the light source 31 is provided on the rear surface side of the substrate 10. The single-photon source 1 illustrated in FIG. 16 can accurately concentrate the single photons P by the lens 70, as in the case illustrated in FIG. 15. The lens 70 of course can be used in combination with the distributed Bragg mirror and the optical resonator.

Second Embodiment

Figure 17:
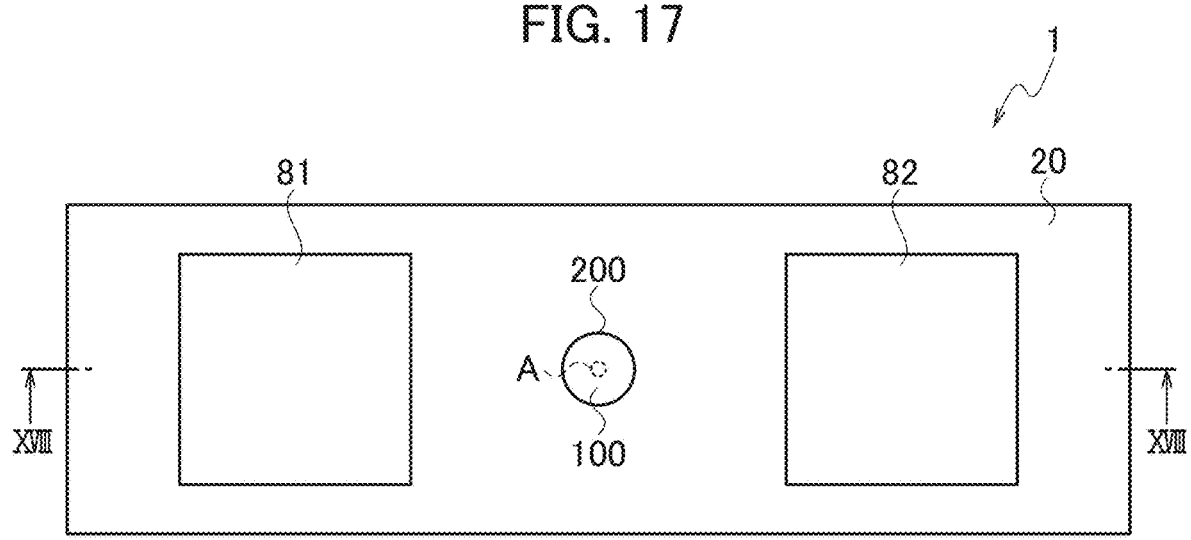
FIG. 17 is a schematic plan view illustrating a configuration of a single-photon source according to a second embodiment.

The single-photon source 1 according to a second embodiment illustrated in FIG. 17 includes a pair of main electrodes of a first main electrode 81 and a second main electrode 82 as the excitation system by the EL method arranged on the main surface of the substrate 10 to interpose the light-emission region 100 therebetween. The single-photon source 1 illustrated in FIG. 17 differs from the single-photon source 1 according to the first embodiment illustrated in FIG. 1 in that the EL method is used as the excitation system for shifting the electrons at the point defect A from the ground state to the excited state, while the first embodiment uses the PL method as the excitation system. The other configurations in the second embodiment are the same as those in the first embodiment.

The single-photon source 1 illustrated in FIG. 17 excites the electrons at the point defect A by the electrical energy generated between the first main electrode 81 and the second main electrode 82. A gap between the first main electrode 81 and the second main electrode 82 is about 10 μm, for example.

Figure 18:
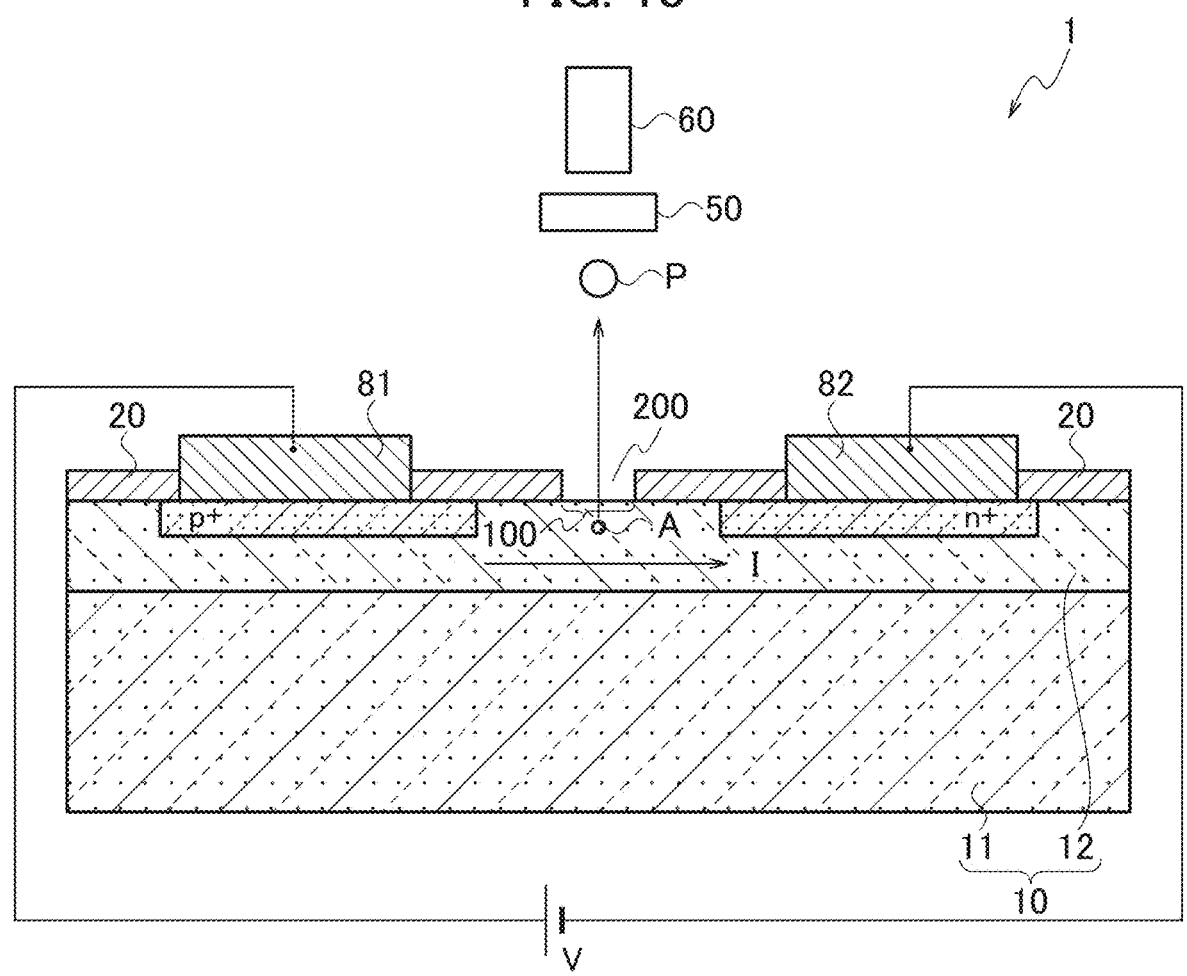
FIG. 18 is a schematic cross-sectional view illustrating the configuration of the single-photon source according to the second embodiment.

In particular, as illustrated in FIG. 18, a voltage V is applied between the first main electrode 81 and the second main electrode 82 so as to lead a current I to flow through the light-emission region 100. The flow of the current I provides the electrical energy to the electrons at the point defect A. The single photon P is thus output from the point defect A to the outside through the opening 200 of the cover mask 20. The first main electrode 81 and the second main electrode 82 are made of Al, for example. FIG. 18 is a cross-sectional view taken along line XVIII-XVIII in FIG. 17. The substrate 10 has a stacked structure including a semiconductor substrate 11 of a wide-bandgap semiconductor and a semiconductor layer 12 that is an epitaxial layer of a wide-bandgap semiconductor. The opening 200 is located above the point defect A for releasing the single photon P present in a $p^+$-doped region, an $n^+$-doped region, or other region provided in the semiconductor layer 12.

Figure 19:
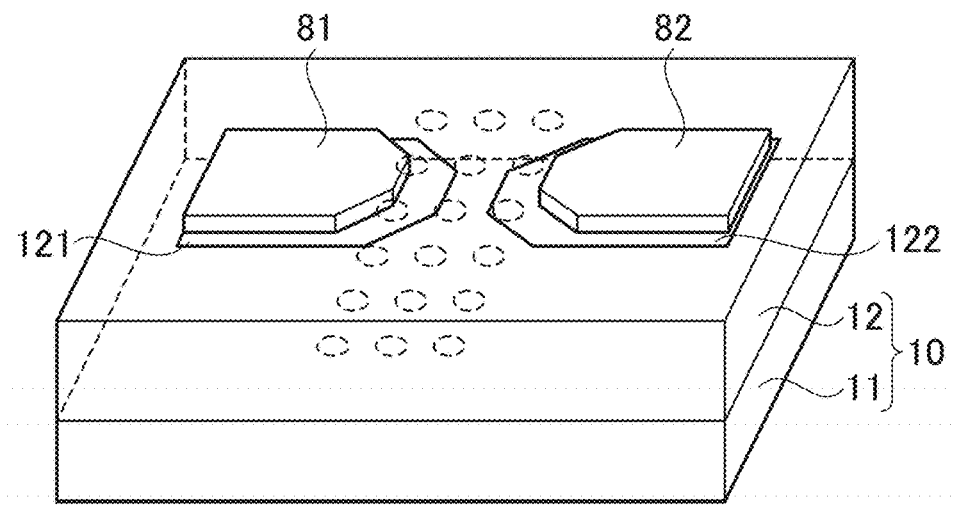
FIG. 19 is a schematic view illustrating a case of releasing single photons by an EL method.

FIG. 19 is a view showing an example in which the electrons are excited by the EL method to release the photons. FIG. 19 illustrates a case in which the plural point defects A are provided in the main surface of the substrate 10 to emit the photons by use of the first main electrode 81 and the second main electrode 82 as the excitation system. The substrate 10 illustrated in FIG. 19 has a structure in which the semiconductor layer 12 of p-type is deposited on the semiconductor substrate 11 of SiC, for example. The first main electrode 81 is arranged on a first semiconductor region 121 of $p^+$-type formed on the semiconductor layer 12. The second main electrode 82 is arranged on a second semiconductor region 122 of $n^+$-type formed on the semiconductor layer 12. A gap between the first semiconductor region 121 and the second semiconductor region 122 is set to 20 μm, and a gap between the first main electrode 81 and the second main electrode 82 is set to 40 μm.

Figure 20:
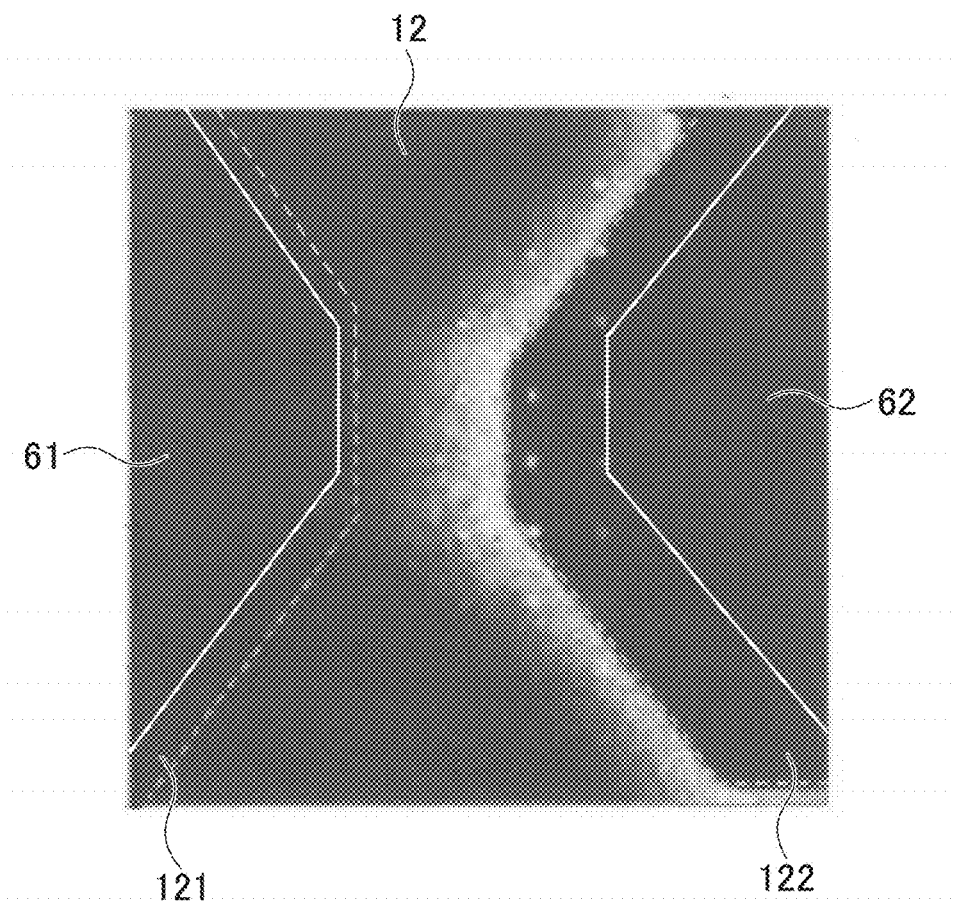
FIG. 20 is a plan view showing a state of releasing single photons by the EL method.

FIG. 20 is a view showing a state in which the photons are released from the point defects A illustrated in FIG. 19. As shown in FIG. 20, which indicates luminous points derived from the photons by the white dots, a large number of the photons are released from the point defects A adjacent to the P-N junction. In addition, the photons are also released from the point defects A in the $n^+$-type second semiconductor region 122. While the photons are released when forward bias is applied to the first main electrode 81 and the second main electrode 82, the photons are also released in the case of reverse bias.

The single-photon source 1 illustrated in FIG. 17 can limitedly output the single photon P to the outside only from the single point defect A formed in the light-emission region 100 due to the cover mask 20.

Modified Example

Figure 21:
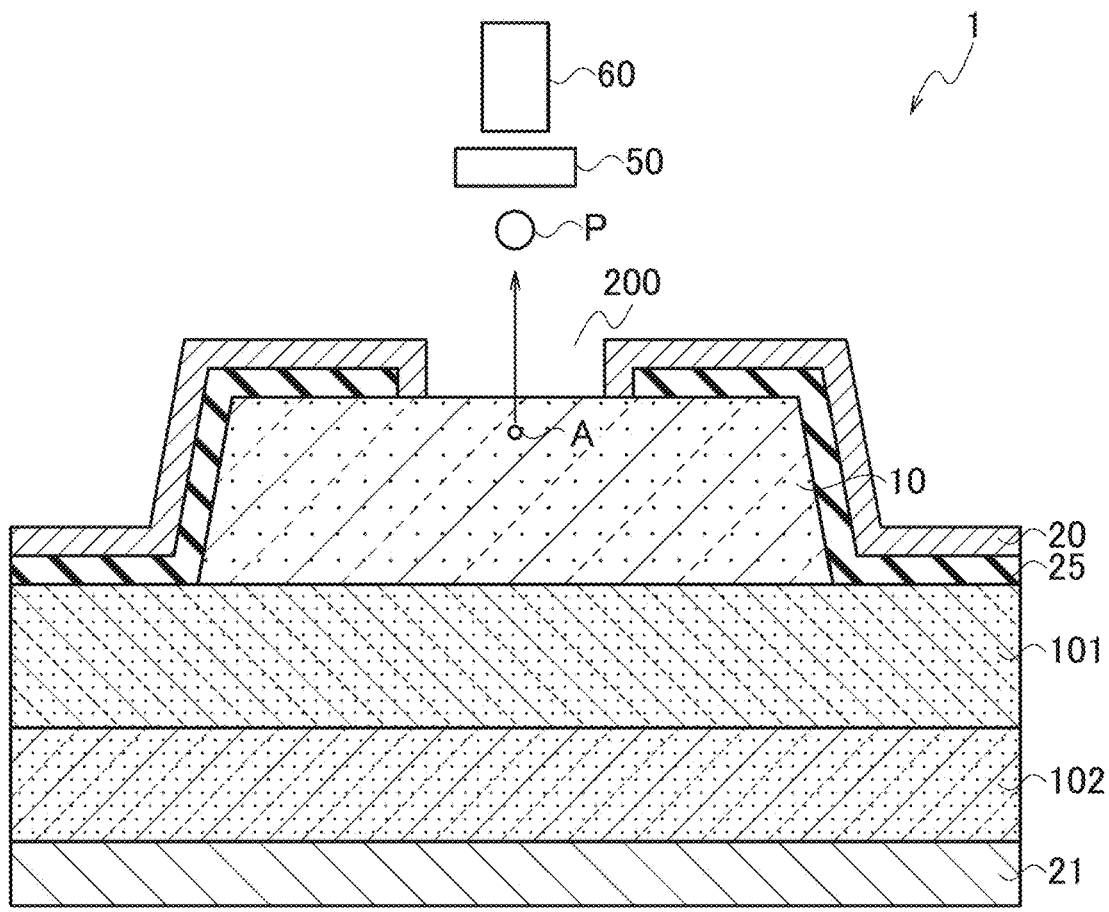
FIG. 21 is a schematic cross-sectional view illustrating a configuration of a single-photon source according to a modified example of the second embodiment.
Figure 22:
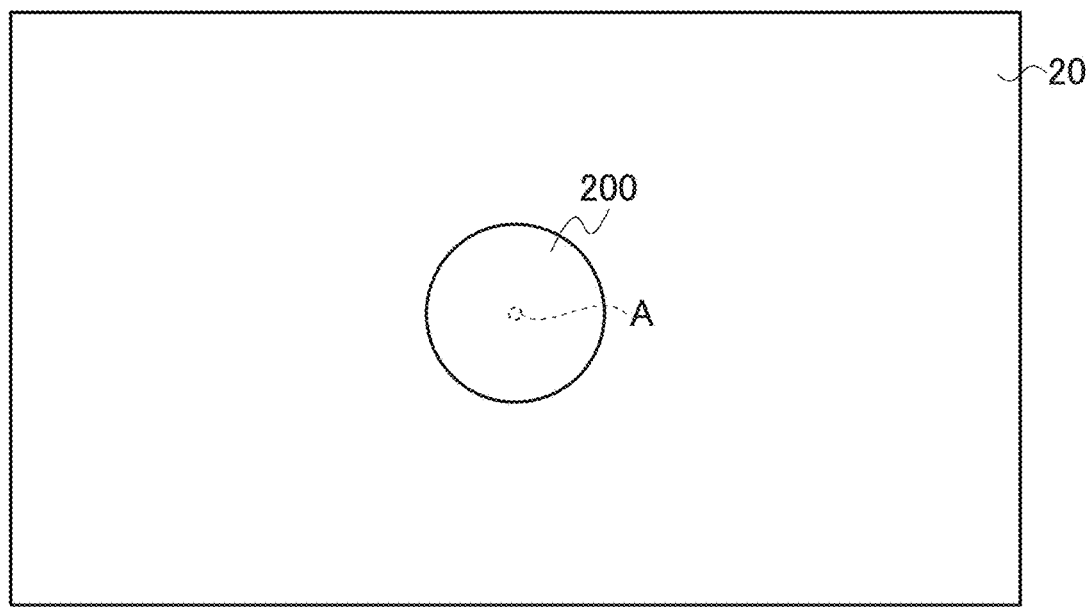
FIG. 22 is a schematic plan view illustrating the single-photon source illustrated in FIG. 21.

The use of the distributed Bragg mirror 101 using the EL method as the excitation system is an alternative example, as illustrated in FIG. 21. The single-photon source 1 illustrated in FIG. 21 has a structure in which the support substrate 102 and the distributed Bragg mirror 101 are deposited on the top surface of a lower electrode 21, and the substrate 10 having a mesa structure is arranged on the top surface of the distributed Bragg mirror 101. The side surface and the top surface of the substrate 10 are provided with the cover mask 20 via an upper insulating layer 25. The cover mask 20 also serves as an upper electrode. FIG. 22 is a plan view of the single-photon source 1 illustrated in FIG. 21.

In the single-photon source 1 illustrated in FIG. 21, a current flows through the substrate 10 in the vertical direction between the cover mask 20 and the lower electrode 21, so that the single photon P is output from the point defect A to the outside via the opening 200 of the cover mask 20. The single photon released toward the rear surface side of the substrate 10 is reflected by the distributed Bragg mirror 101 to return to the main surface side. This improves the efficiency of extracting the single photons through the opening 200. The mesa structure of the substrate 10 and the cover mask 20 provided on the side surface of the substrate 10 can reduce the influence of dissipation of the single photons toward the side surface of the substrate 10.

Figure 23:
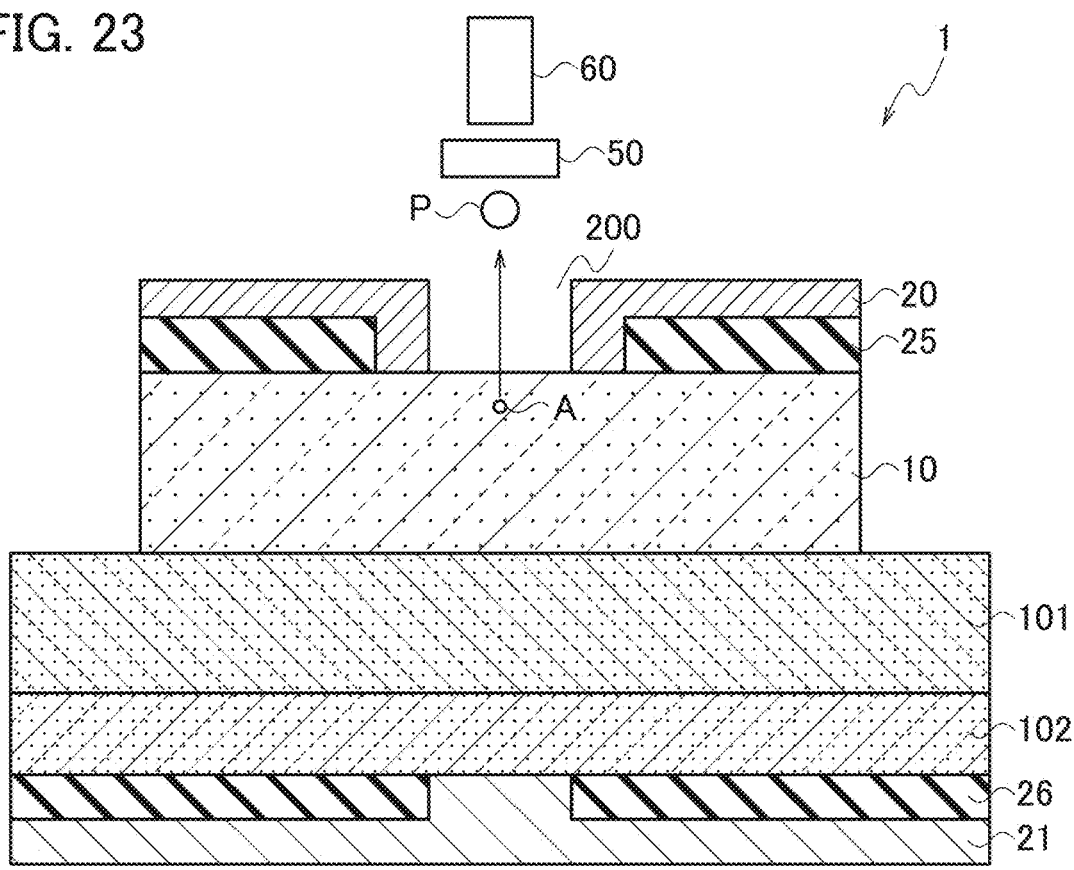
FIG. 23 is a schematic cross-sectional view illustrating another configuration of the single-photon source according to the modified example of the second embodiment.
Figure 24:
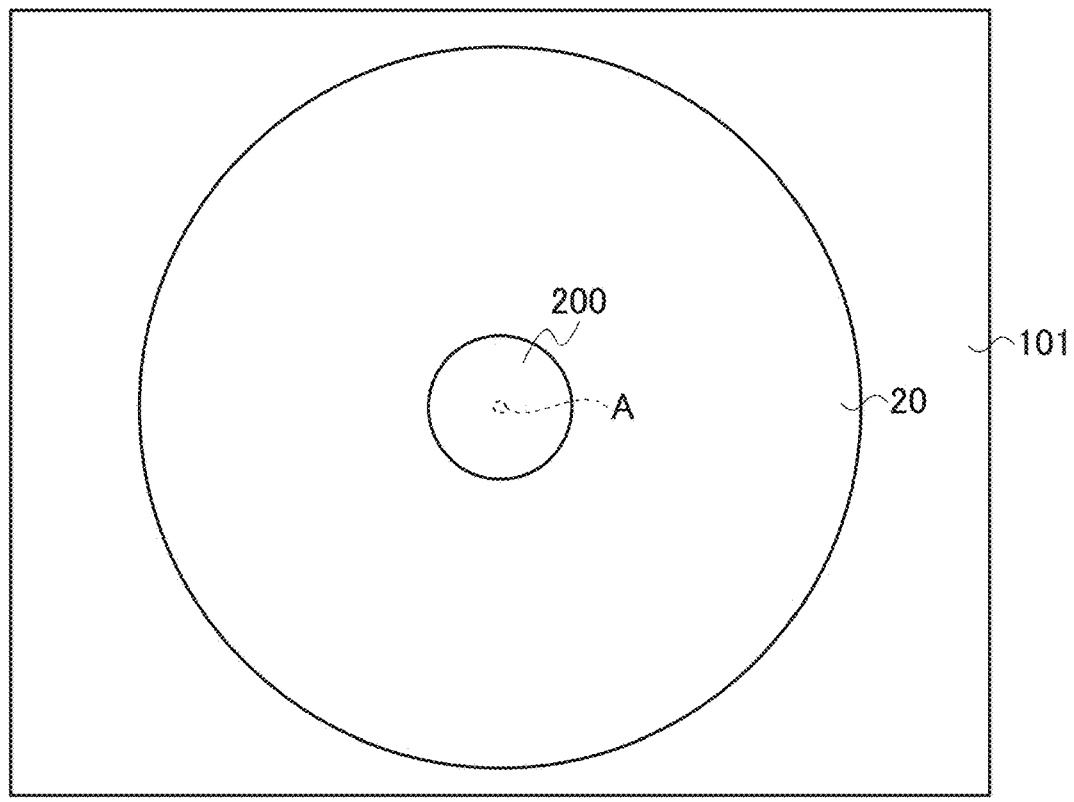
FIG. 24 is a schematic plan view illustrating the single-photon source illustrated in FIG. 23.

The single-photon source 1 illustrated in FIG. 23 is a modified example of the single-photon source 1 illustrated in FIG. 21. FIG. 24 is a plan view of the single-photon source 1 illustrated in FIG. 23. The substrate 10 formed into a cylinder shape can prevent the dissipation of the single photons toward the side surface of the substrate 10. As illustrated in FIG. 23, a lower insulating layer 26 provided with an opening having substantially the same area as the opening 200 is arranged on the rear surface of the support substrate 102 so as to bring the lower electrode 21 into contact with the support substrate 102 through the opening provided in the lower insulating layer 26. This structure can limit the path of the current that flows in the vertical direction of the substrate.

Figure 25:
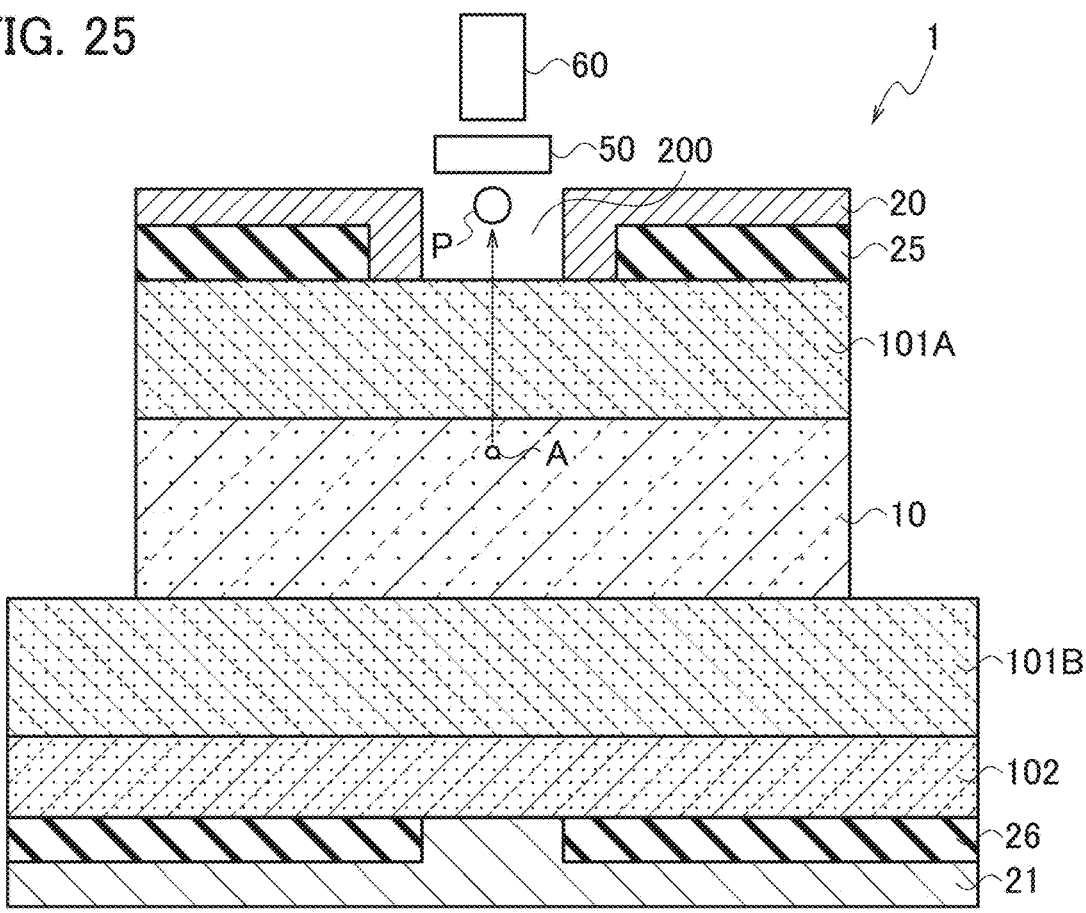
FIG. 25 is a schematic cross-sectional view illustrating still another configuration of the single-photon source according to the modified example of the second embodiment.
Figure 26:
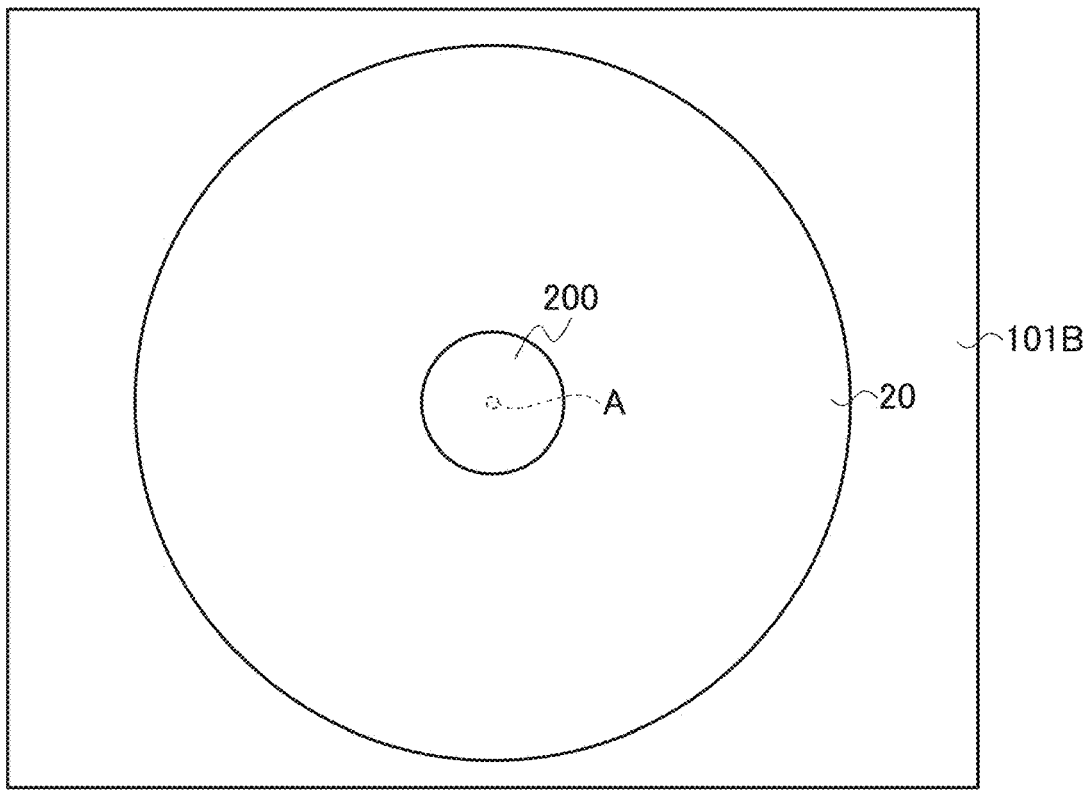
FIG. 26 is a schematic plan view illustrating the single-photon source illustrated in FIG. 25.

The single-photon source 1 illustrated in FIG. 25 has a structure for efficiently extracting the single photon P generated by the EL method by the optical resonator. FIG. 26 is a plan view of the single-photon source 1 illustrated in FIG. 25. The single-photon source 1 having the electrode structure on the rear surface side of the substrate similar to the structure illustrated in FIG. 23 can limit the path of the current that flows in the vertical direction of the substrate. The single photon P is selectively amplified by the upper distributed Bragg mirror 101A and the lower distributed Bragg mirror 101B so as to be released through the opening 200 of the cover mask 20.

As described above, the single-photon source 1 according to the second embodiment can optically stably output the photons at room temperature by use of the EL method as the excitation system. The other effects in the second embodiment are substantially the same as those in the first embodiment, and overlapping explanations are not repeated below.

Other Embodiments

While the present disclosure has been described above with reference to the respective embodiments, it should be understood that the respective embodiments are not intended to be limited to the descriptions and the drawings composing part of this disclosure. Various alternative embodiments, examples, and technical applications will be apparent to those skilled in the art according to this disclosure.

Figure 27:
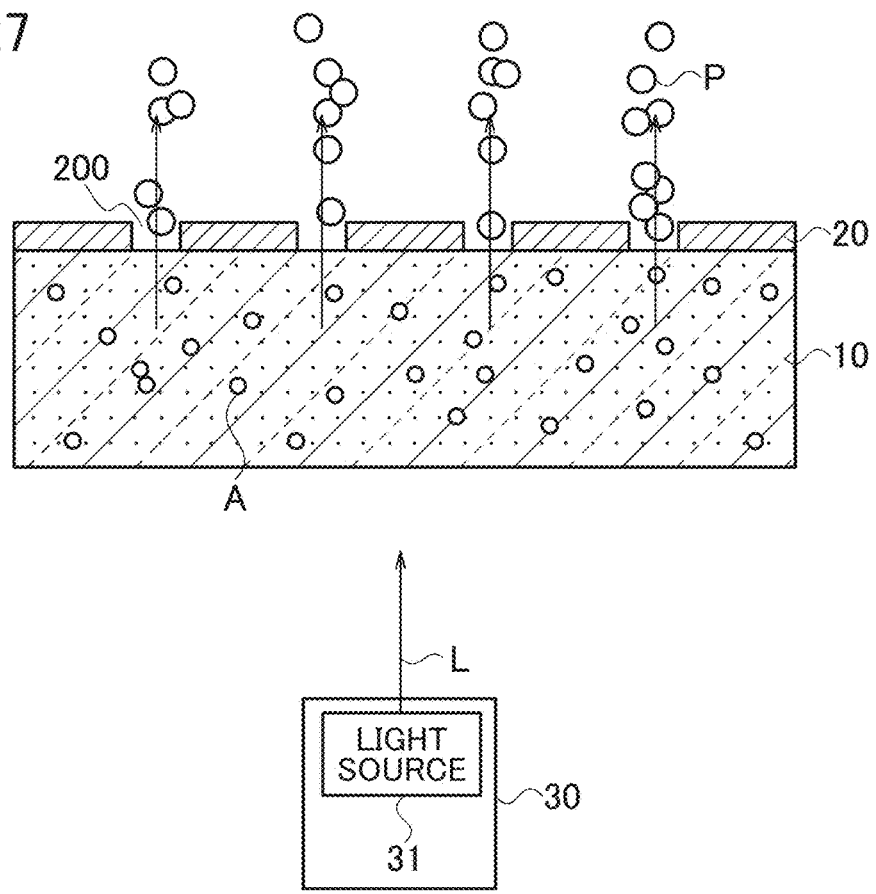
FIG. 27 is a schematic cross-sectional view illustrating a configuration of a quantum sensor according to another embodiment.
Figure 28:
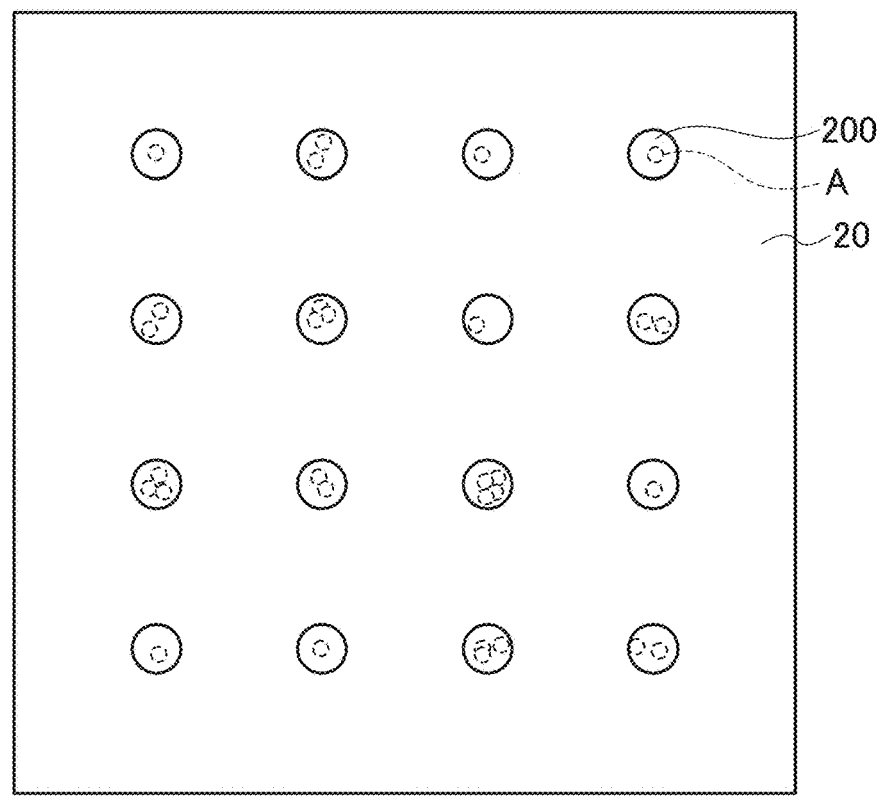
FIG. 28 is a schematic plan view illustrating the quantum sensor illustrated in FIG. 27.

For example, a plurality of single-photon sources 1 may be arranged on the same plane to compose a quantum sensor. In particular, the single-photon sources 1 are arranged into a matrix to inspect the positions of the single-photon sources 1 from which the single photons are output, so as to measure a spatial distribution of a physical amount such as a distribution of an electric field or a magnetic field or a temperature distribution. As illustrated in FIG. 27 and FIG. 28, one substrate 10 may be provided with plural target point defects A so that the cover mask 20 is provided with plural openings 200 to which plural light-emission regions 100 corresponding to the plural point defects A are exposed.

It should be understood that the present disclosure includes various embodiments not disclosed herein.

What is claimed is:

1. A single-photon source comprising:
   a substrate of a wide-bandgap semiconductor provided with a light-emission region including only one target point defect;
   a cover mask arranged on a main surface of the substrate and having an opening to which the light-emission region in the substrate is exposed; and
   an excitation system configured to shift an electron in a defect-ground state to an excited state at the point defect in the light-emission region,
   wherein a single photon released from the point defect in the light-emission region when the electron in the excited state is shifted to the ground state is output through the opening in the cover mask, and
   the excitation system includes a pair of main electrodes provided on the main surface of the substrate to interpose the light-emission region therebetween so as to excite the electron at the point defect by electrical energy generated between the respective main electrodes.

2. The single-photon source according to claim 1, wherein the excitation system irradiates the light-emission region exposed to the opening in the cover mask with an excitation light to excite the electron at the point defect.

3. The single-photon source according to claim 1, further comprising a lens arranged immediately above the light-emission region and allowing the single photon to pass therethrough.

4. The single-photon source according to claim 1, wherein an optical resonator is configured to include the substrate and elements interposing the substrate therebetween so as to resonate a wavelength of the single photon released from the point defect.

5. The single-photon source according to claim 1, wherein the point defect is formed at a depth of several hundreds of nanometers to several tens of micrometers from the main surface of the substrate.

6. A method of outputting a single photon, comprising:
   forming a light-emission region including only one target point defect in a substrate of a wide-bandgap semiconductor;
   arranging a cover mask having an opening on a main surface of the substrate so as to expose the light-emission region in the substrate to the opening;
   shifting an electron in a defect-ground state to an excited state at the point defect in the light-emission region; and
   outputting a single photon released from the point defect in the light-emission region through the opening in the cover mask when the electron in the excited state is shifted to the ground state,
   wherein the electron is excited at the point defect by electrical energy generated between a pair of main electrodes provided on the main surface of the substrate to interpose the light-emission region therebetween.

7. The method of outputting the single photon according to claim 6, wherein the light-emission region exposed to the opening in the cover mask is irradiated with an excitation light so as to excite the electron at the point defect.

8. The method of outputting the single photon according to claim 6, wherein the point defect is formed at a depth of several hundreds of nanometers to several tens of micrometers from the main surface of the substrate.

9. A single-photon source comprising:
   a substrate of a wide-bandgap semiconductor provided with a light-emission region including only one target point defect;
   a cover mask arranged on a main surface of the substrate and having an opening to which the light-emission region in the substrate is exposed; and
   an excitation system configured to shift an electron in a defect-ground state to an excited state at the point defect in the light-emission region,
   wherein a single photon released from the point defect in the light-emission region when the electron in the excited state is shifted to the ground state is output through the opening in the cover mask, and
   the excitation system irradiates the light-emission region exposed to the opening in the cover mask with an excitation light to excite the electron at the point defect.

10. The single-photon source according to claim 9, wherein the excitation system includes a pair of main electrodes provided on the main surface of the substrate to interpose the light-emission region therebetween so as to excite the electron at the point defect by electrical energy generated between the respective main electrodes.

11. A method of outputting a single photon, comprising:
    forming a light-emission region including only one target point defect in a substrate of a wide-bandgap semiconductor;
    arranging a cover mask having an opening on a main surface of the substrate so as to expose the light-emission region in the substrate to the opening;
    shifting an electron in a defect-ground state to an excited state at the point defect in the light-emission region; and
    outputting a single photon released from the point defect in the light-emission region through the opening in the cover mask when the electron in the excited state is shifted to the ground state,
    wherein the light-emission region exposed to the opening in the cover mask is irradiated with an excitation light so as to excite the electron at the point defect.

12. The method of outputting the single photon according to claim 11, wherein the electron is excited at the point defect by electrical energy generated between a pair of main electrodes provided on the main surface of the substrate to interpose the light-emission region therebetween.

13. A single-photon source comprising:
    a substrate of a wide-bandgap semiconductor provided with a light-emission region including only one target point defect;
    a cover mask arranged on a main surface of the substrate and having an opening to which the light-emission region in the substrate is exposed; and
    an excitation system configured to shift an electron in a defect-ground state to an excited state at the point defect in the light-emission region,
    wherein a single photon released from the point defect in the light-emission region when the electron in the excited state is shifted to the ground state is output through the opening in the cover mask, and
    the excitation system irradiates an excitation light from a rear surface side of the substrate to excite the electron at the point defect.

14. A method of outputting a single photon, comprising:
    forming a light-emission region including only one target point defect in a substrate of a wide-bandgap semiconductor;

arranging a cover mask having an opening on a main surface of the substrate so as to expose the light-emission region in the substrate to the opening;

shifting an electron in a defect-ground state to an excited state at the point defect in the light-emission region; and outputting a single photon released from the point defect in the light-emission region through the opening in the cover mask when the electron in the excited state is shifted to the ground state, wherein the excitation system irradiates an excitation light from a rear surface side of the substrate to excite the electron at the point defect.

15. A single-photon source comprising:

a substrate of a wide-bandgap semiconductor provided with a light-emission region including only one target point defect;

a cover mask arranged on a main surface of the substrate and having an opening to which the light-emission region in the substrate is exposed; and an excitation system configured to shift an electron in a defect-ground state to an excited state at the point defect in the light-emission region, wherein a single photon released from the point defect in the light-emission region when the electron in the excited state is shifted to the ground state is output through the opening in the cover mask, and an optical resonator is configured to include the substrate and elements interposing the substrate therebetween so as to resonate a wavelength of the single photon released from the point defect, and the excitation system irradiates an excitation light from a rear surface side of the substrate to excite the electron at the point defect.

16. A method of outputting a single photon, comprising:

forming a light-emission region including only one target point defect in a substrate of a wide-bandgap semiconductor;

arranging a cover mask having an opening on a main surface of the substrate so as to expose the light-emission region in the substrate to the opening;

shifting an electron in a defect-ground state to an excited state at the point defect in the light-emission region; and outputting a single photon released from the point defect in the light-emission region through the opening in the cover mask when the electron in the excited state is shifted to the ground state, wherein an optical resonator is configured to include the substrate and elements interposing the substrate therebetween so as to resonate a wavelength of the single photon released from the point defect, and the excitation system irradiates an excitation light from a rear surface side of the substrate to excite the electron at the point defect.

17. A single-photon source comprising:

a substrate of a wide-bandgap semiconductor provided with a light-emission region including only one target point defect;

a cover mask arranged on a main surface of the substrate and having an opening to which the light-emission region in the substrate is exposed; and an excitation system configured to shift an electron in a defect-ground state to an excited state at the point defect in the light-emission region, wherein a single photon released from the point defect in the light-emission region when the electron in the excited state is shifted to the ground state is output through the opening in the cover mask, and the point defect is formed at a depth of several hundreds of nanometers to several tens of micrometers from the main surface of the substrate so that a quantum state of point defect is not affected by impurities and defects present.

18. A method of outputting a single photon, comprising:

forming a light-emission region including only one target point defect in a substrate of a wide-bandgap semiconductor;

arranging a cover mask having an opening on a main surface of the substrate so as to expose the light-emission region in the substrate to the opening;

shifting an electron in a defect-ground state to an excited state at the point defect in the light-emission region; and outputting a single photon released from the point defect in the light-emission region through the opening in the cover mask when the electron in the excited state is shifted to the ground state, wherein the point defect is formed at a depth of several hundreds of nanometers to several tens of micrometers from the main surface of the substrate so that a quantum state of point defect is not affected by impurities and defects present.

19. A single-photon source comprising:

a substrate of a wide-bandgap semiconductor provided with a light-emission region including only one target point defect;

a cover mask arranged on a main surface of the substrate and having an opening to which the light-emission region in the substrate is exposed; and an excitation system configured to shift an electron in a defect-ground state to an excited state at the point defect in the light-emission region, wherein a single photon released from the point defect in the light-emission region when the electron in the excited state is shifted to the ground state is output through the opening in the cover mask, and the point defect is formed at a position shallower than a depth in which the carbon ions are implanted to form point defect.

20. A method of outputting a single photon, comprising:

forming a light-emission region including only one target point defect in a substrate of a wide-bandgap semiconductor;

arranging a cover mask having an opening on a main surface of the substrate so as to expose the light-emission region in the substrate to the opening;

shifting an electron in a defect-ground state to an excited state at the point defect in the light-emission region; and outputting a single photon released from the point defect in the light-emission region through the opening in the cover mask when the electron in the excited state is shifted to the ground state, wherein the point defect is formed at a position shallower than a depth in which the carbon ions are implanted to form point defect.

* * * * *